United States Patent
Kang et al.

(10) Patent No.: US 6,992,915 B2
(45) Date of Patent: Jan. 31, 2006

(54) SELF REVERSE BIAS LOW-POWER HIGH-PERFORMANCE STORAGE CIRCUITRY AND RELATED METHODS

(75) Inventors: Sung-Mo Kang, Santa Cruz, CA (US); Seung-Moon Yoo, Austin, TX (US)

(73) Assignee: Regents of the University of California, Oakland, CA (US)

( * ) Notice: Subject to any disclaimer, the term of this patent is extended or adjusted under 35 U.S.C. 154(b) by 195 days.

(21) Appl. No.: 10/402,472

(22) Filed: Mar. 27, 2003

(65) Prior Publication Data

US 2004/0017711 A1    Jan. 29, 2004

Related U.S. Application Data

(60) Provisional application No. 60/368,392, filed on Mar. 27, 2002.

(51) Int. Cl.
*G11C 11/00*    (2006.01)
*G11C 7/00*    (2006.01)

(52) U.S. Cl. .................. 365/154; 365/156; 365/203

(58) Field of Classification Search ........... 365/154, 365/156, 203
See application file for complete search history.

(56) References Cited

U.S. PATENT DOCUMENTS 5,668,770 A    9/1997    Itoh et al.

FOREIGN PATENT DOCUMENTS

JP    58009290 A    1/1983

OTHER PUBLICATIONS

International Search Report mailed Jun. 3, 2005, for PCT application No. PCT/US03/09599 filed on Mar. 27, 2003, 6 pages.

*Primary Examiner*—Trong Phan
(74) *Attorney, Agent, or Firm*—Morrison & Foerster LLP

(57) ABSTRACT

An integrated circuit is provided comprising a first NMOS transistor; a first PMOS transistor; a second NMOS transistor; a second PMOS transistor; a first bias voltage node coupled to a first source/drain of the first NMOS transistor; a second bias voltage node coupled to a first source/drain of the second PMOS; a third bias voltage node coupled to a gate of the first PMOS transistor; a fourth bias voltage node coupled to a gate of the second NMOS transistor; a pull-up node coupling a second source/drain of the first NMOS transistor to a first source/drain of the first PMOS transistor; a pull-down node coupling a second source/drain of the second PMOS transistor to a first source/drain of the second NMOS transistor; an input node; a storage node coupling a second source/drain of the first PMOS transistor to a second source/drain of the second NMOS transistor; an output node; an input switch coupled to controllably communicate an input data value from the input node to a gate of the first NMOS transistor and to a gate of the second PMOS transistor; and an output switch coupled to controllably communicate a stored data value from the storage node to the output node.

101 Claims, 14 Drawing Sheets

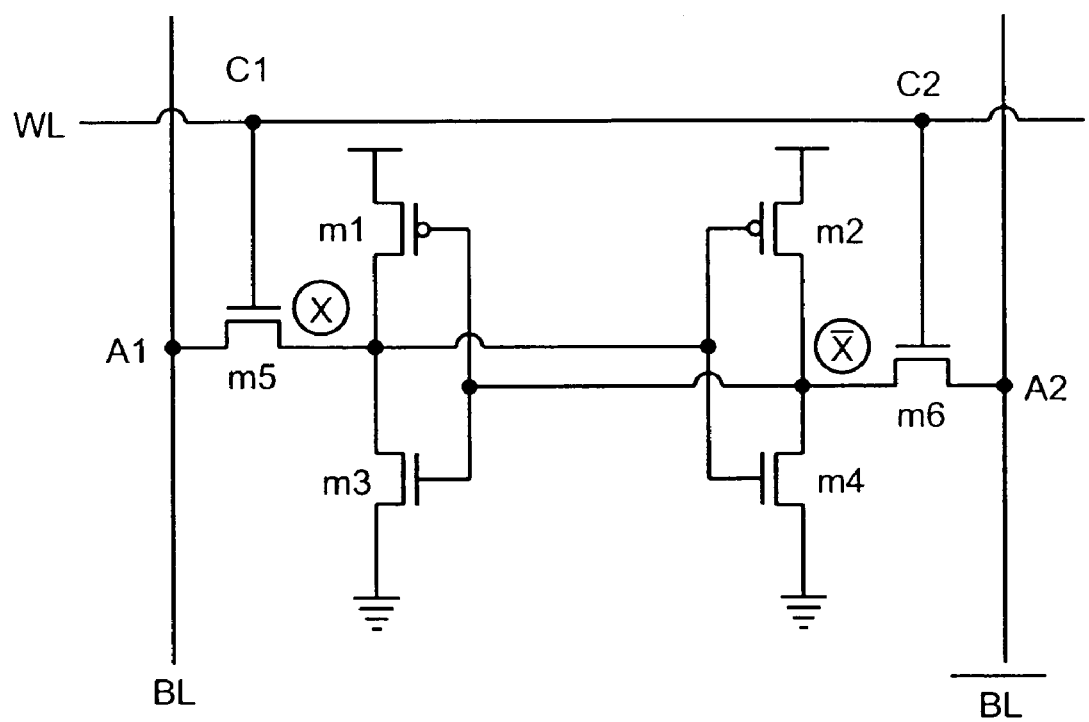
FIG._1A
*(PRIOR ART)*

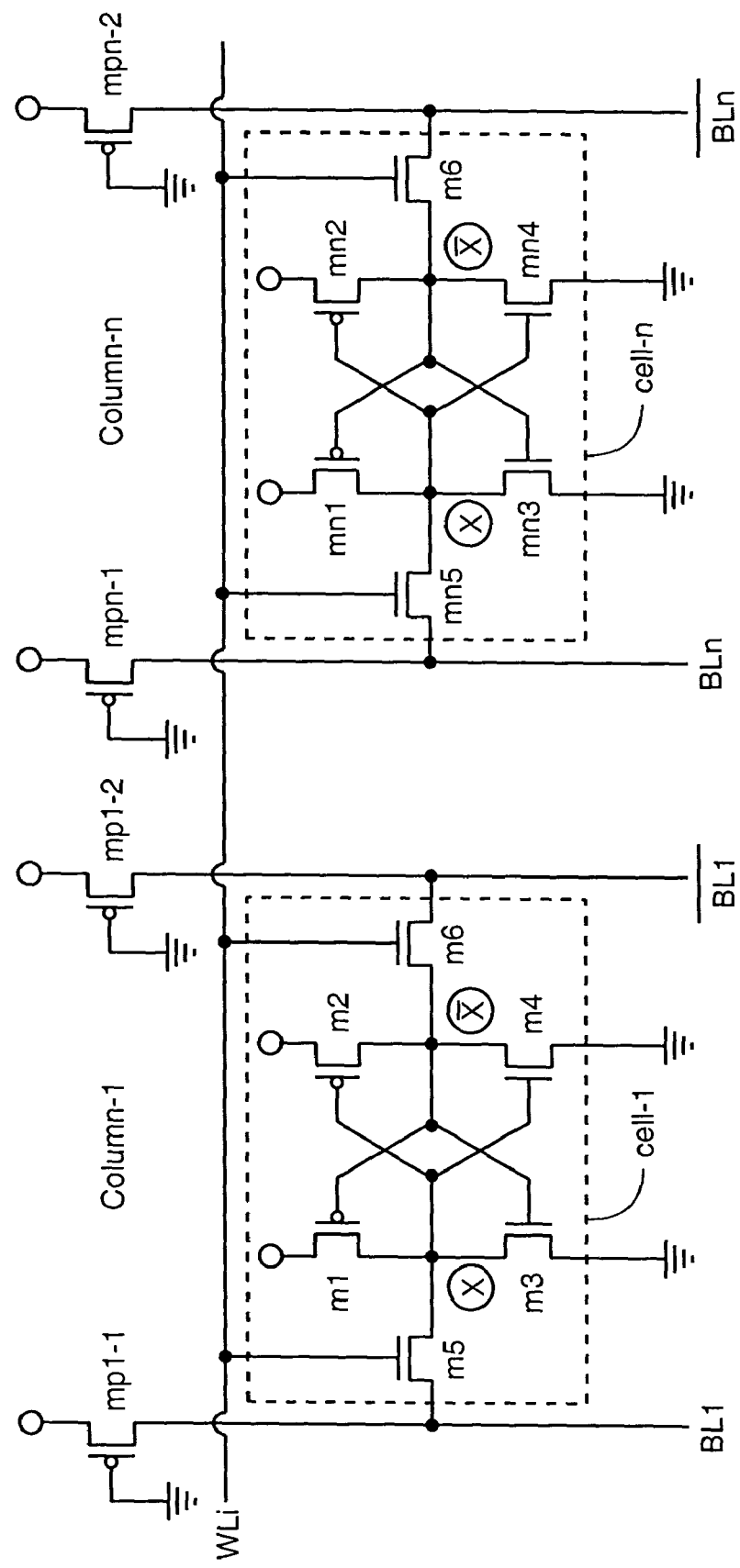
FIG._1B (PRIOR ART)

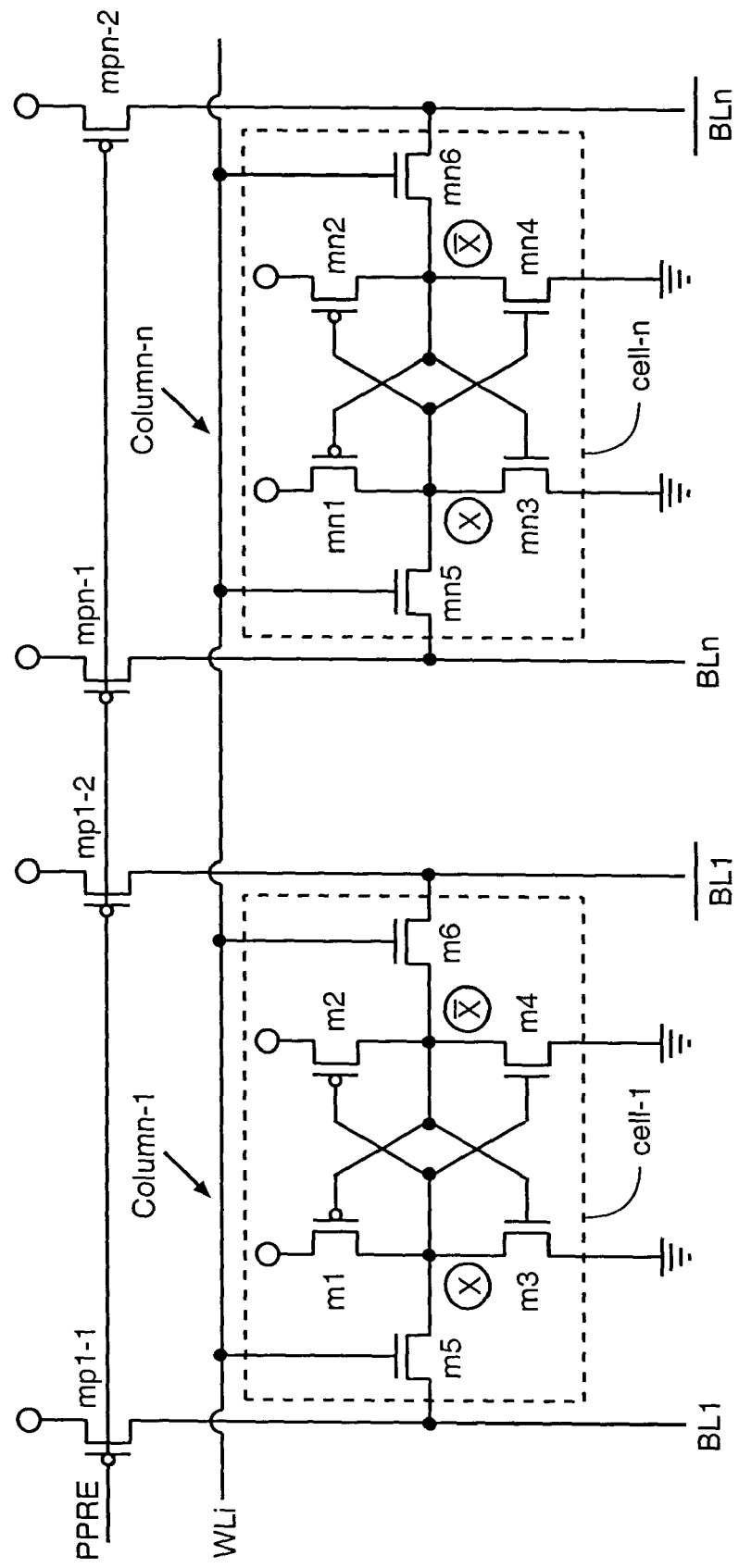
FIG._1C (PRIOR ART)

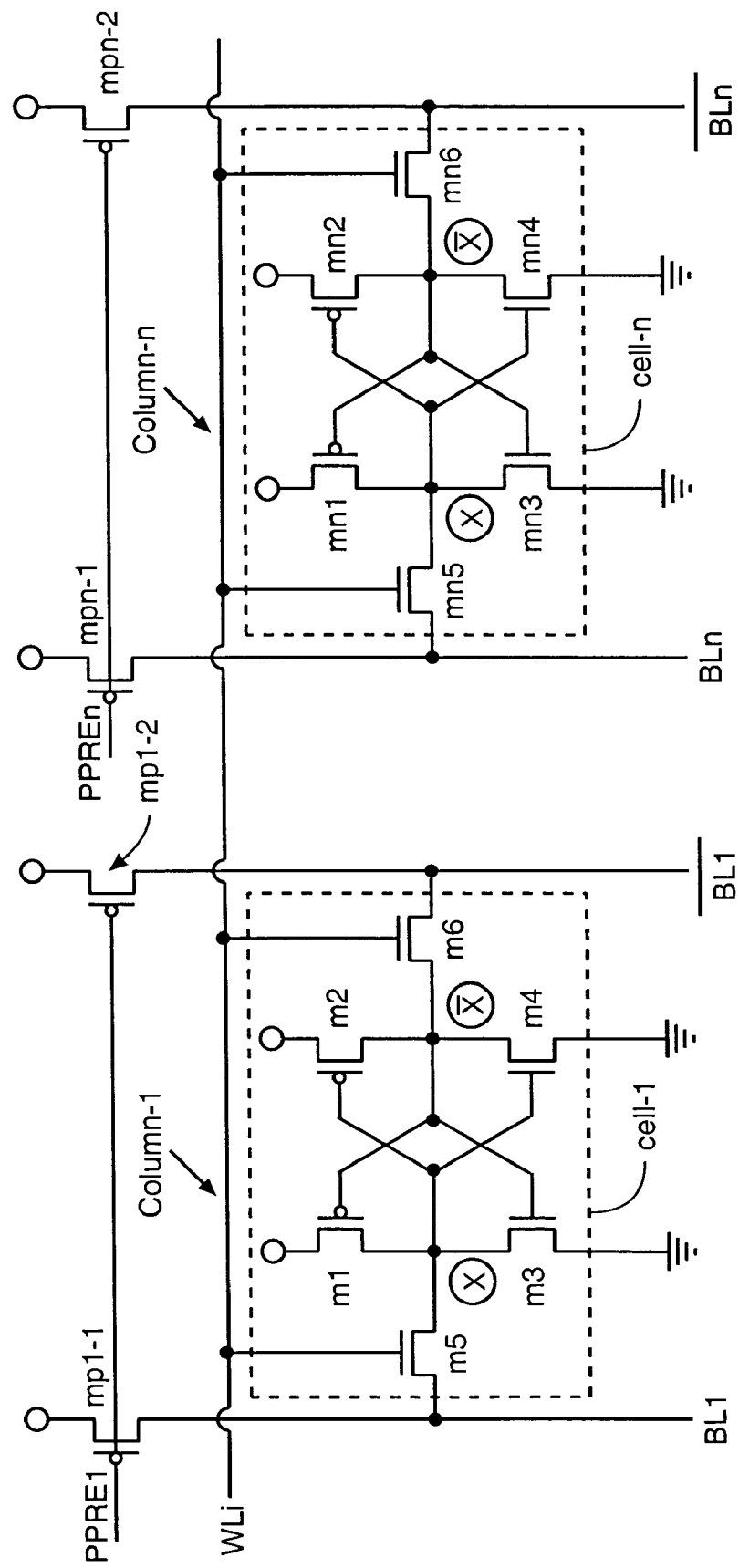
FIG._1D (PRIOR ART)

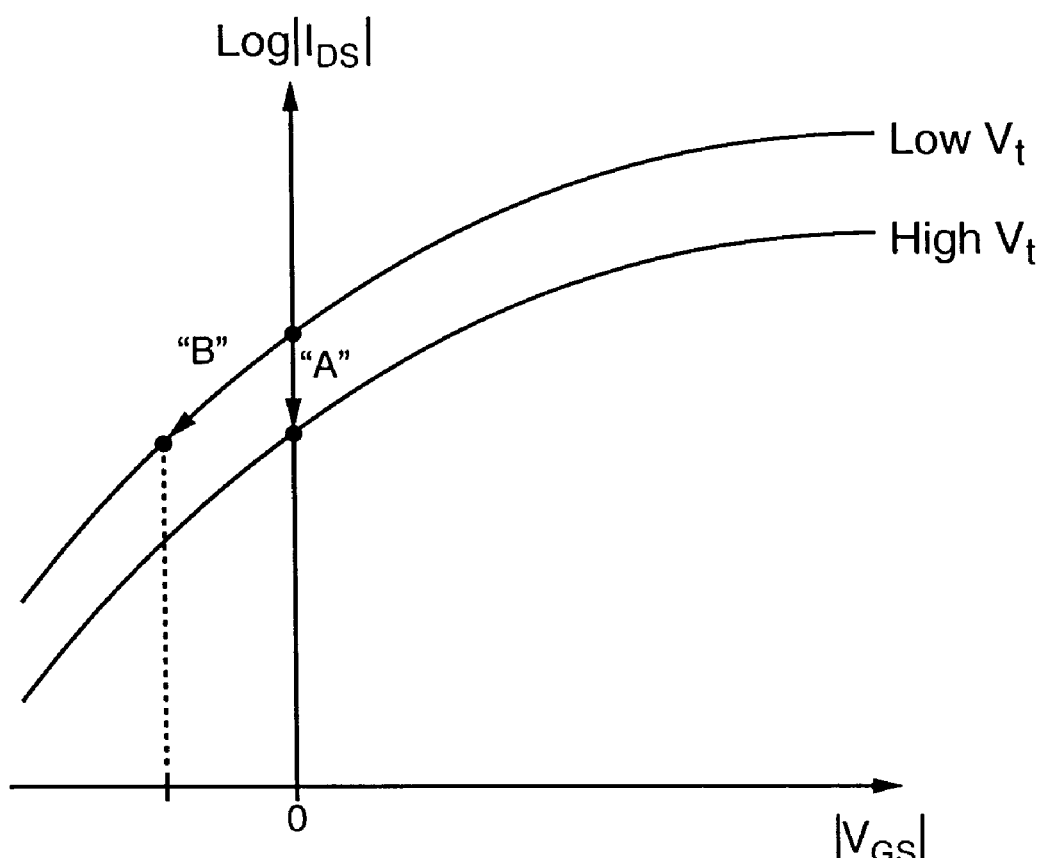
FIG._2
*(PRIOR ART)*

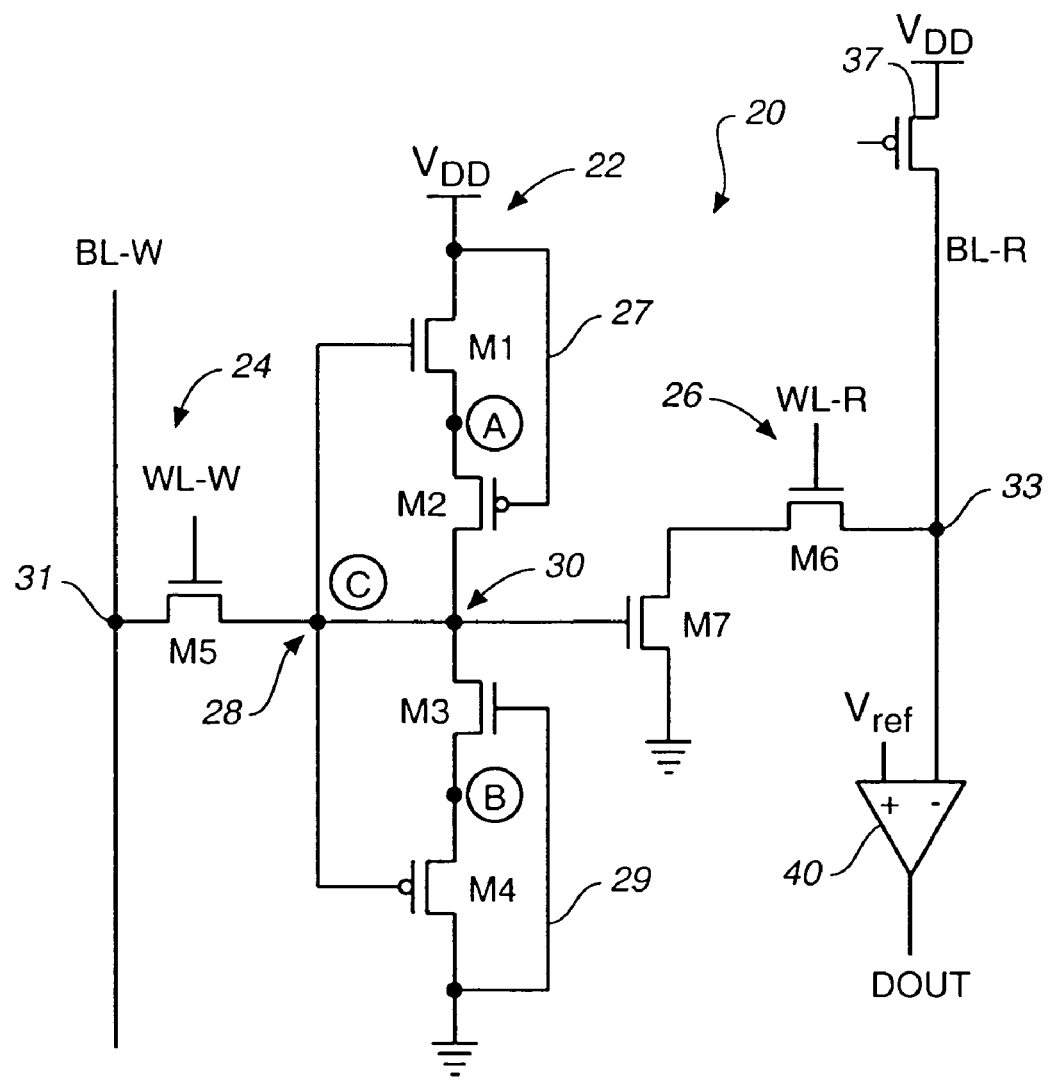
FIG._3

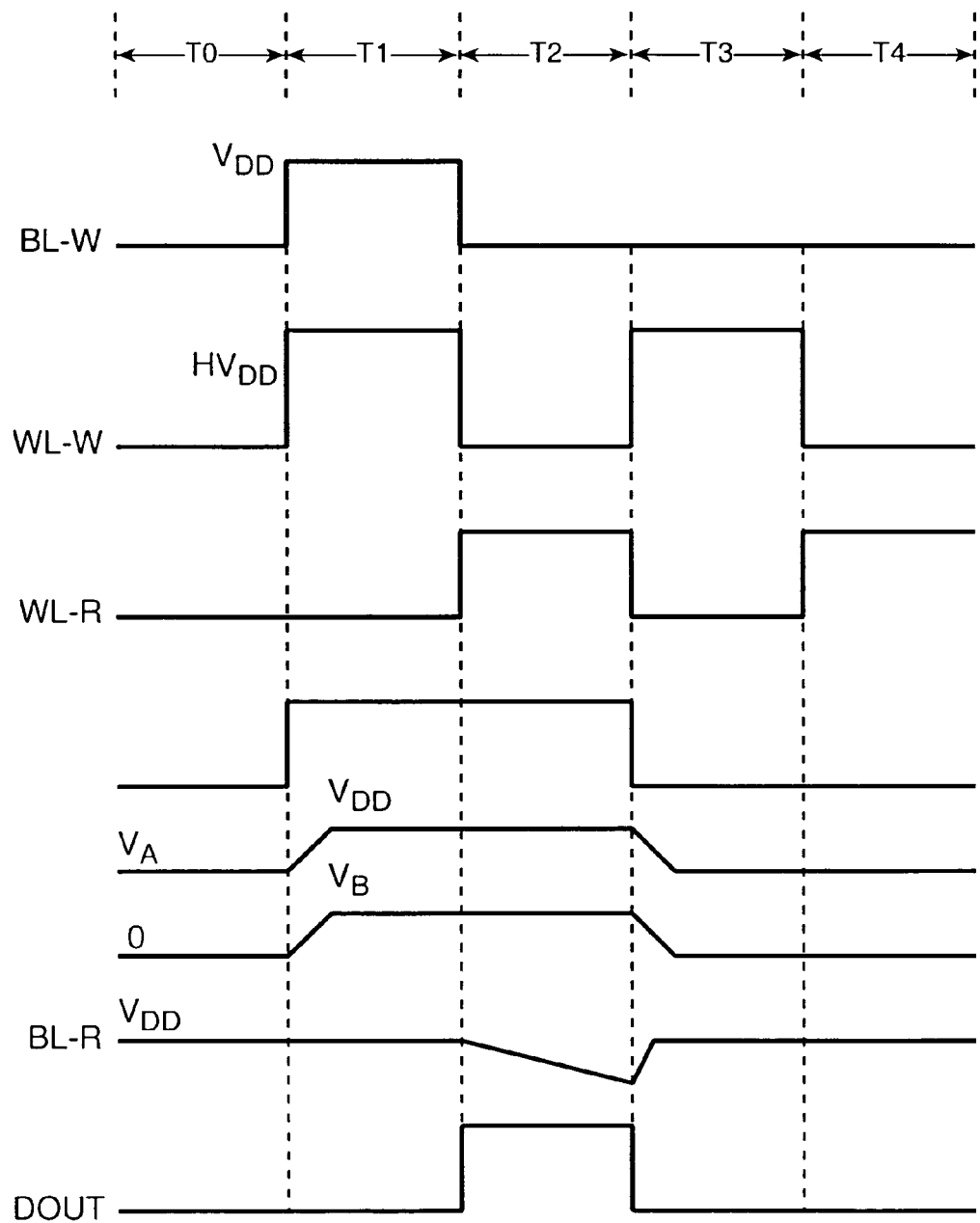
FIG._4

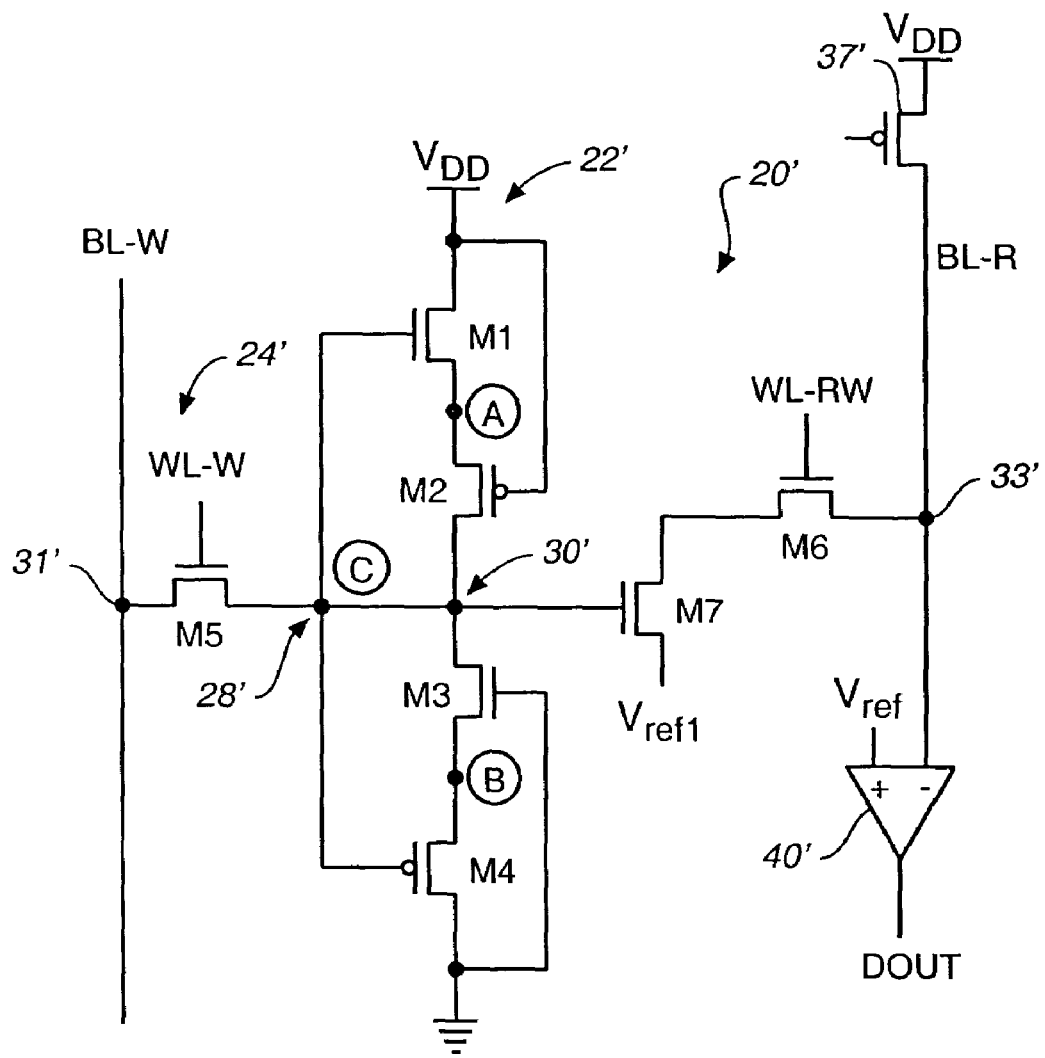
FIG._5

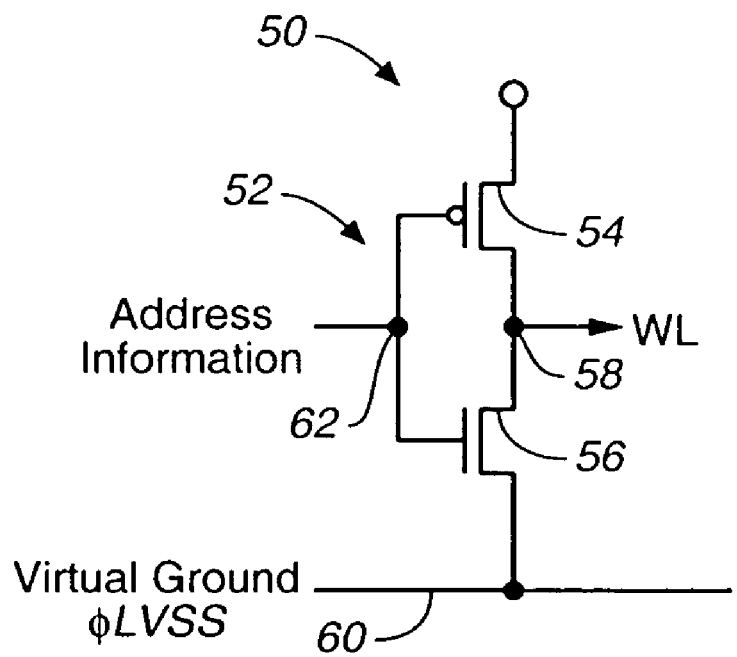
FIG._6A
*(PRIOR ART)*
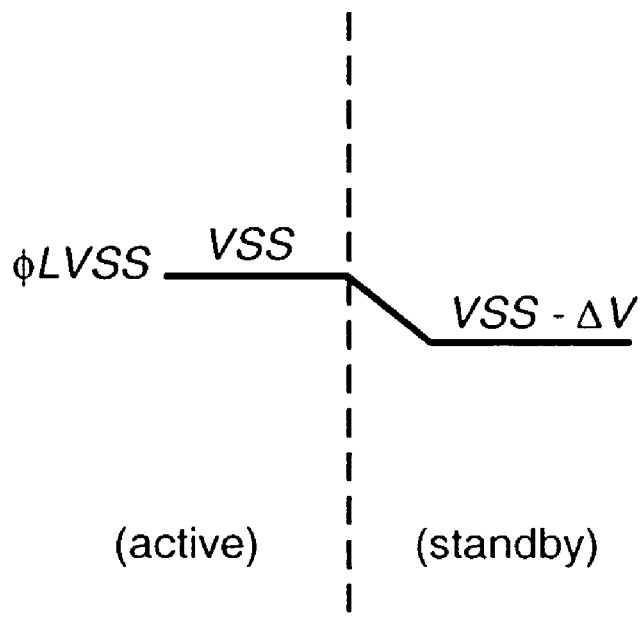
FIG._6B
*(PRIOR ART)*

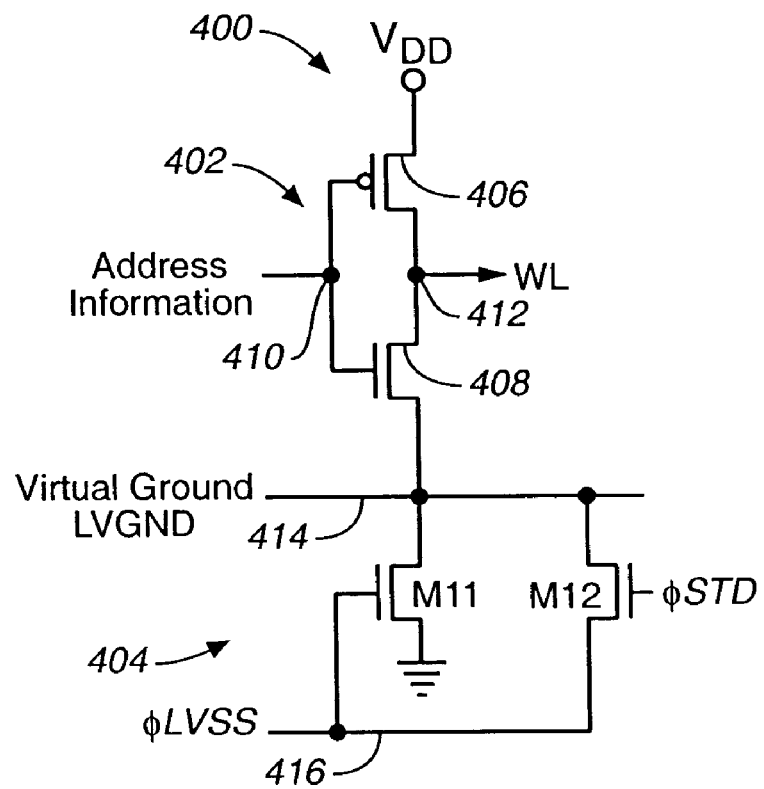
FIG._7A
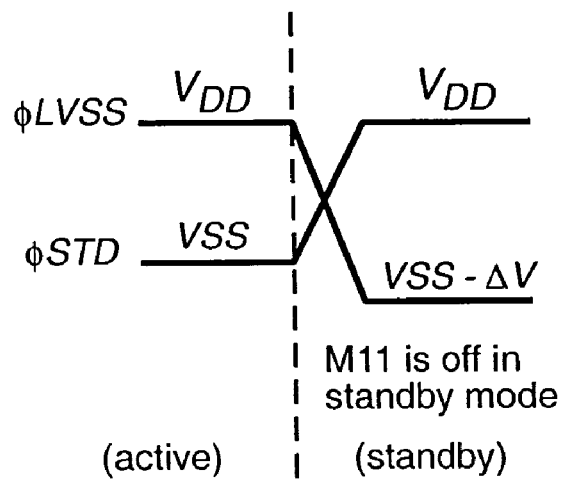
FIG._7B

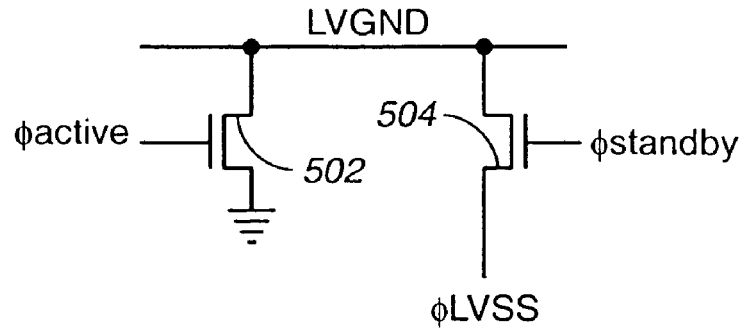
FIG._8A
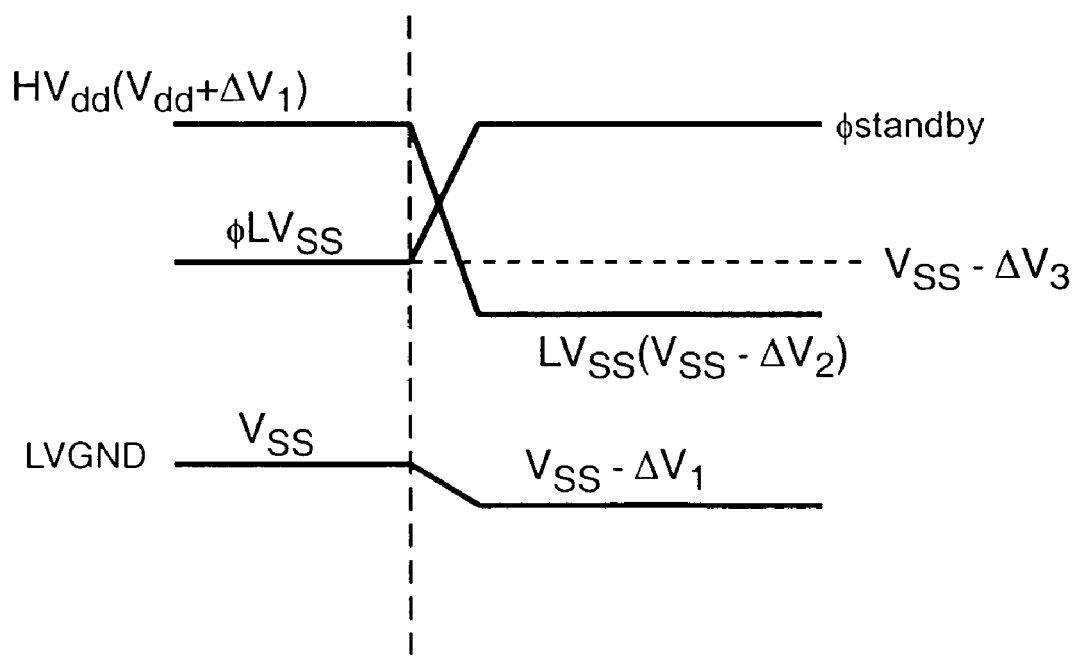
FIG._8B

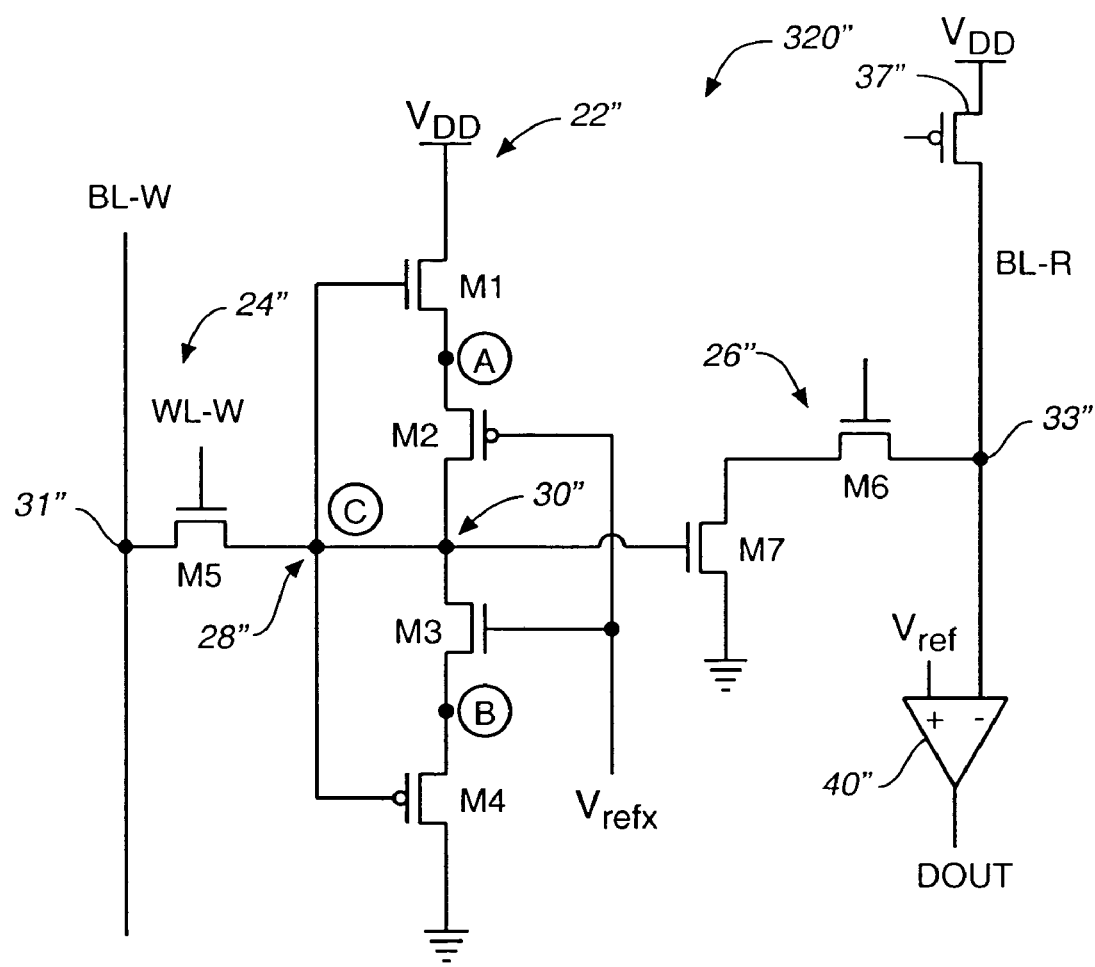
FIG._9

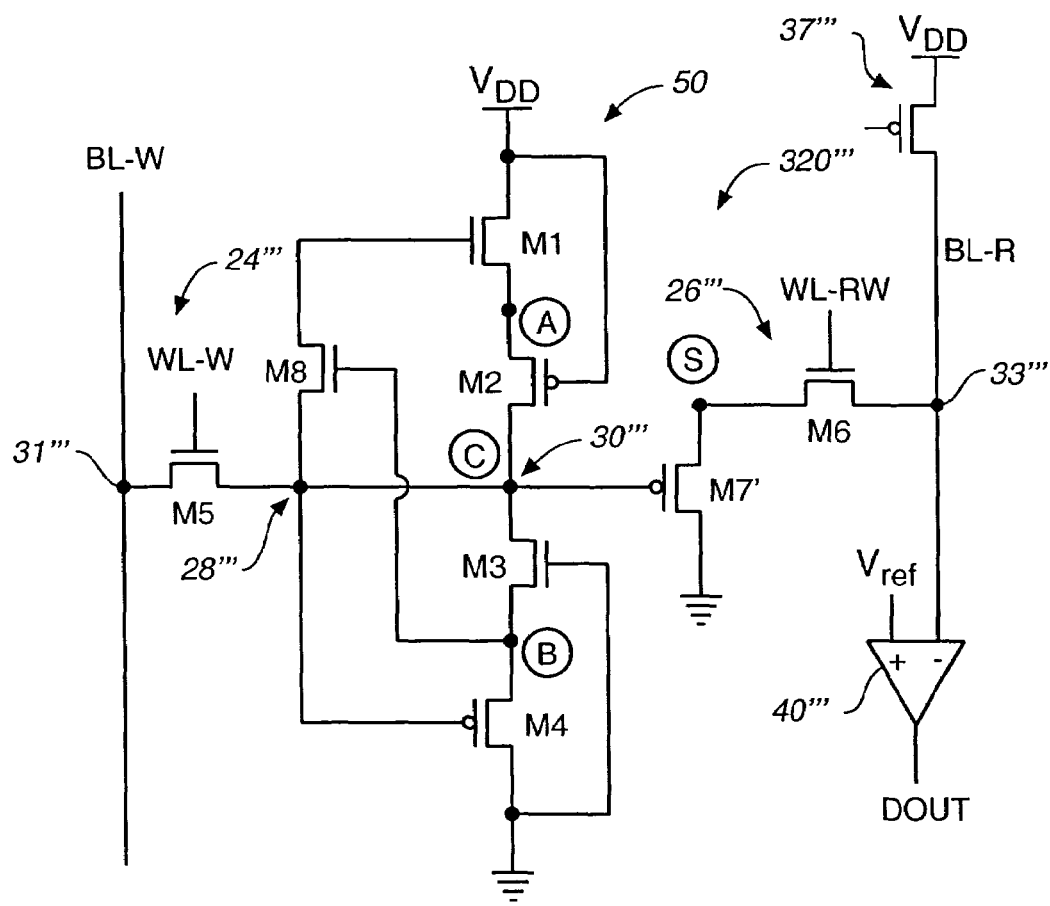
FIG._10

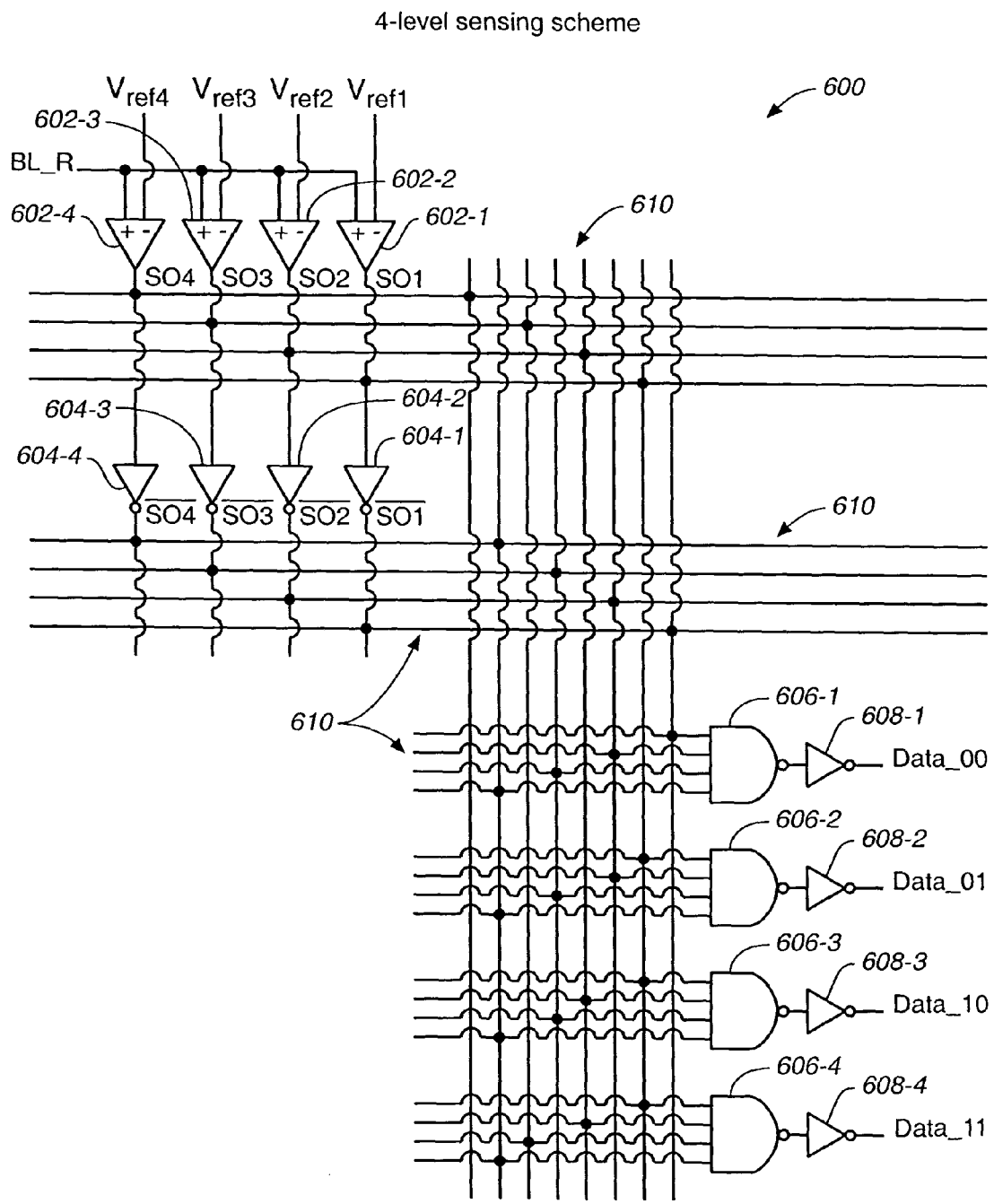
FIG._11

12# SELF REVERSE BIAS LOW-POWER HIGH-PERFORMANCE STORAGE CIRCUITRY AND RELATED METHODS

CROSS-REFERENCE TO RELATED APPLICATIONS

This application claims priority to and the benefit of the filing date of provisional patent application Ser. No. 60/368,392 filed Mar. 27, 2002.

BACKGROUND OF THE INVENTION

1. Field of the Invention

The invention relates to integrated circuits, and more particularly, to integrated circuits used in information storage and retrieval.

2. Description of the Related Art

For over three decades the semiconductor industry has been able to take advantage of the technology scaling according to Moore's Law. A continual increase in memory chip density, and thus the on-chip memory capacity has enabled the development of new products such as portable electronic devices used for mobile computing and communications. Without high-density memory it would not have been possible to have devices such as cell phones, personal digital assistants (PDAs), palm-top computers, or even lap-top computers. Power Consumption has become a significant factor in use of such portable devices. Power Consumption affects battery life, and lower power consumption leads to longer battery life. Static Random Access Memory (SRAM), has been an important component of portable devices since it consumes less power and is generally faster than dynamic RAM (DRAM) that requires periodic refresh operation to prevent loss of memory contents. Currently 16 Mb SRAMs and 256 Mb DRAMs are available on the market.

For portable device applications that require SRAM, low standby current is highly desirable so as to extend the battery lifetime. Otherwise, rapid depletion of the battery power can limit the use of portable devices and also can inconvenience users of those devices by requiring them to carry spare batteries, for example. In a present generation of portable devices, the typical standby current of a portable device is 5–10 microamperes ($10^{-6}$ A). Ideally, the standby current would be zero, and the less the better. Standby current has several components, and one of the most significant components is due to leakage in memory cells. As the desired memory capacity for portable devices has grown, it is increasingly important to suppress the leakage current. Unfortunately, the leakage current in prior memory circuits tended to increase for each generation of technology scaling according to a physical law. It is well known that the subthreshold current of a Metal-Oxide Semiconductor (MOS) transistor increases exponentially as the device threshold voltage is scaled down as required for chip performance with a downscaled power supply voltage. This leakage current phenomenon in an MOS transistor is described generally in the following equation:

$$I_{leakage} = K^* \exp((Vgs-Vt)/(S/ln\ 10))(1-\exp(-Vds/V_T)) \quad (1)$$

where K is a constant that depends on the technology, Vgs is the gate-to-source voltage (=Vg−Vs), Vt is the device threshold voltage, S is the subthreshold voltage swing, $V_T$ is the thermal voltage (=kT/q) with k denoting the Boltzman's constant. S, the subthreshold swing voltage, can be described by $$S = (kT\ ln\ 10)/q^*(1+Cd/Cox) \quad (2)$$

Equation (1) suggests that an increase in Vt can be used to reduce the leakage current, and this approach is practiced reluctantly in VLSI design despite a speed penalty. In other words, increased Vt results in both reduced leakage current and increased signal propagation delay within the circuit. Thus, typically there has been a trade-off between a desire to minimize leakage current and a desire to maximize speed. This trade-off generally has been acceptable as long as reduced leakage current transistors with increased Vt are not in speed-critical paths. Ordinarily, transistors in speed-critical paths should have lower threshold voltages in order to ensure reduced signal propagation delay leading to increased circuit speed. However, lower threshold voltage can result in relatively heavy leakage currents in standby mode.

FIG. 1A is an illustrative circuit diagram of a known integrated circuit data storage cell of the type referred to as an SRAM cell. This prior SRAM cell includes six transistors, two transistors for access (m5, m6) and four transistors (m1, m2, m3, m4) for latching data with two cross-coupled inverters (m1-m3 pair and m2-m4 pair). Transistors m1–m4 serve as storage circuitry. In this example, the storage circuitry operates by latching data. Transistors m5 and m6 serve as access transistors for writing data to and reading data from the storage circuitry. Suppose, for example, that the stored data is logic "1." The data-storing node X is set to high ("1") and the other data-storing node X-bar is set to low ("0"). Therefore, transistors m1 and m4 are turned on while transistors m2 and m3 are turned off. Access transistors, m5 and m6, are turned on by driving wordline (WL) high and are turned off by driving wordline (WL) low. When m5 and m6 are turned on, BL is linked to node X and BL-bar is linked to X-bar.

More specifically, the integrated circuit data storage cell includes a latch circuit including first and second inverters. A first inverter includes a first high threshold voltage PMOS transistor m1 and a first high threshold voltage NMOS transistor m3 and a first data node X comprising interconnected source/drains (S/D) of the first PMOS m1 and NMOS m3 transistors. A second inverter includes a second high threshold voltage PMOS transistor m2 and a second high threshold voltage NMOS transistor m4 with a second data node X-bar comprising interconnected source/drains (S/D) of the second PMOS transistor m2 and NMOS m4 transistor. The gates of the first PMOS transistor m1 and first NMOS transistor m3 are coupled to the second data node X-bar. The gates of the second PMOS transistor m2 and the second NMOS transistor m4 are coupled to the first data node X. A first low threshold voltage access transistor m5 includes a first S/D coupled to the first data node X and to the gate of the second PMOS transistor m2 and to the gate of the second NMOS transistor m4 and includes a second S/D coupled to a first data access node A1 and includes a gate coupled to a first access control node C1. A second low threshold voltage access transistor m6 includes a first S/D coupled to the second data node X-bar and to the gate of the first PMOS transistor m1 and to the gate of the first NMOS transistor m3 and includes a second S/D coupled to a second data access node A2 and includes a gate coupled to a second access control node C2.

During a write operation, for example, when WL is high, data "1" on BL can be fed to node X by turning on access transistor m5, and at the same time, data "0" on BL-bar can be fed to node X-bar by turning on access transistor m6. The latching by m1-m3 and m2-m4 pairs enable stable storage of data "1" at node X even after the access transistors m5 and m6 are turned off with low voltage on WL line. Conversely, data "0" can be written to node X by providing logic "0" on BL while providing logic "1" on BL-bar when access transistors m5 and m6 are turned on by a high WL signal.

Conversely, during a read operation, both BL and BL-bar are pre-charged to a high voltage level, e.g., $V_{DD}$. If the voltage level at node X-bar is low, then the voltage on BL-bar will discharge through m4. If the voltage level at node X-bar is high, then the voltage on BL-bar will not discharge through m4. Instead, the voltage of BL will discharge through m3. A sense amplifier (not shown) can sense a small voltage drop on either BL or BL-bar so as to determine the voltage level stored at nodes X and X-bar and generate an output signal, e.g. high when the stored data is high or low when the stored data is low.

Unfortunately, there have been reliability problems with this earlier SRAM cell. For instance, if m3 is leaky and conducts current from node X to ground, then the charge stored at that node can be reduced, pulling down the node voltage at X, which in turn can make m2 leak some charge into node X-bar. Voltage build up at node X-bar can in turn promote more leakage current through m3 potentially causing a transition to a new erroneous locked state. Thus, current leakage can result in reliability problems by causing erroneous data storage.

Another problem with the prior SRAM structure of FIG. 1A is that the voltage of a cell node can be influenced by bit line voltages during a read operation. For example, assume that the voltages of X and X-bar are high and low respectively, and BL and BL-bar are precharged at $V_{DD}$. When WL is enabled, m5 and m6 become to turned on. Node X at the junction of m1 and m3 is coupled to BL, and node X-bar at the junction of m2 and m4 is coupled to BL-bar. Since BL-bar is precharged to VDD and the level of X-bar is low (e.g., VSS), the voltage level on BL-bar can influence the voltage level at node X-bar. One approach to reducing the influence that the voltage on BL-bar has on node X-bar is to increase the impedance of m6. However, increasing the impedance of m6 also slows down the read speed. Thus, there is a tradeoff between circuit stability and read speed.

In addition, leakage currents in standby mode can cause draining of the battery. FIG. 2 is an illustrative drawing of an I-V characteristics of a MOS transistor for two different threshold voltages (low Vt and high Vt). As explained by equation (1), the higher the threshold voltage, the lower the leakage current (Ids) in magnitude. Thus, design option "A" would use high Vt to lower the leakage current, but this would cause speed degradation since the signal propagation delay increases as Vt increases for a fixed Vgs ($<V_{DD}$) swing. It is known that the propagation delay driven by a MOS transistor is inversely proportional to (Vgs–Vt). Thus, for a given Vgs, there is more delay at higher Vt. By comparison, design option "B" would use low Vt to increase speed by reducing signal propagation delay but leakage current can be reduced by making the transistor reverse-biased when the transistor is turned-off.

Although, the fact that leakage current can be reduced when a transistor is reversed-biased has been known, there still exists a need for an integrated circuit data storage cell that suppresses leakage current without performance degradation and reliability issues. In particular, there has been a need for an SRAM cell that reduces power consumption without sacrificing high speed performance.

There also has been a need for increased memory capacity within a given chip area. In order to store more information within a given area of a chip, the individual storage cell area should be small. For this reason, in the past, layout experts often did data storage cell layout manually. Even a tiny saving in the unit cell area can lead to significantly increased storage capacity within an overall chip area, especially when many data storage cells are used repeatedly on a chip. One approach that has been considered for increasing information storage capacity is to store more than one bit of data in a single memory cell. If two data bits can be stored in one unit cell, then effectively the memory capacity can be doubled for the same chip area. Moreover, the chip area for a given data storage capacity could be reduced, thus increasing the production yield. There has been a need for a memory cell architecture that allows a simple approach to implementing multiple-bit storage in a single memory cell.

In addition, there has existed a need to reduce power consumption due to precharging of bit lines for read operations and to reduce chip area occupied by precharge circuitry. FIGS. 1B–1D are illustrative circuit diagrams of showing the known cell of FIG. 1A coupled in a typical SRAM array structure in which each array has m-rows (WL) and n-columns (BL and BL-bar) of cells. Each column includes a bit line pair BL and BL-bar. Each array of FIGS. 1B–1D has a different known precharge circuitry configuration. More particularly, FIGS. 1B–1D show a first cell, cell-1 in a first column column-1 and a last cell, cell-n of a last column column-n of row m. Specifically, cell-1 and cell-n include respective input transistors m5 and m6 with gates coupled to WLm. Respective S/D terminals of m5 and m6 input transistors of cell-1 are respectively coupled to BL1 and BL1-bar. Respective S/D terminals of m5 and m6 input transistors are respectively coupled to BLn and BLn-bar.

FIG. 1B shows a first precharge circuitry configuration in which, at the end of each bit line, a precharge transistor, e.g., PMOS transistors mp1-1, mp1-2 mpn-1 and mpn-2, is placed to set the bit line (BL) and bit line bar (BL-bar) voltages at a certain level. For example, the notation "mp1-1" indicates, row-m, precharge, column-1, coupled to first bit line (BL1) of cell. For example, the notation "mpn-2" indicates, row-m, precharge, column-n, coupled to second bit line (BLn-bar) of the cell.

In the precharge circuitry configuration of FIG. 1B, all BL lines and all BL-bar lines are precharged to $V_{DD}$ through mp1-1, mp1-2, mpn-1 and mpn-2. The gates of these transistors are coupled to a power supply level, e.g., $V_{SS}$ in this example, and thus, the precharge transistors are always turned on, and the BL lines and BL-bar lines are continually precharged to $V_{DD}$.

FIG. 1C shows a second precharge circuitry configuration similar to that of FIG. 1B. However in the configuration of FIG. 1C the precharge transistors are controlled by a precharge control signal PPRE.

FIG. 1D shows a third precharge circuitry configuration in which each bit line pair has a dedicated control signal, e.g., PPRE1 for BL1 and BL1-bar and PPREn for BLn and BLn-bar. These dedicated control signals permit selective precharging of bit pairs. Selective precharging can reduce power consumption since current paths not involved in a read operation are not unnecessarily precharged. Moreover, cells in a given SRAM array can be divided into groups, and different respective precharge signals can be used to control precharging of different respective groups of cells. For example, assuming that there are 128 cells in an SRAM array, and that only 16 bits of cell data are read at a time, then the cells of the array can be divided into 8 groups, and each group can have a different precharge control signal.

While a precharge circuitry configuration such as that of FIG. 1D can reduce precharge-related power consumption, there has existed a need for further improvements in precharge-related power consumption and for precharge circuitry that occupies less chip area.

The present invention meets these needs.

SUMMARY OF THE INVENTION

One aspect of the invention, for example, provides an integrated circuit storage device. The device includes first NMOS and PMOS transistors and second NMOS and PMOS transistors. A first source/drain of the first NMOS transistor serves as a first bias node. A first source/drain of the second PMOS transistor serves as a second bias node. A gate of the first PMOS transistor serves as a third bias node. A gate of the second NMOS transistor serves as a fourth bias node. A junction of a second source/drain of the first NMOS transistor and a first source/drain of the first PMOS transistor serves as a pull-up node. A junction of a second source/drain of the second PMOS transistor and a first source/drain of the second NMOS transistor serves as a pull-down node. The storage device also includes an input node, a storage node and an output node. The storage node is at a junction of a second source/drain of the first PMOS transistor and a second source/drain of the second NMOS transistor. An input switch controls transmission of an input data value from the input node to a gate of the first NMOS transistor and to a gate of the second PMOS transistor. An output switch controls transmission of a stored data value from the storage node to the output node.

Another aspect of the invention, for example, provides an integrated circuit multi-voltage level storage device. The device includes first NMOS and PMOS transistors and second NMOS and PMOS transistors. A first source/drain of the first NMOS transistor serves as a first bias node. A first source/drain of the second PMOS transistor serves as a second bias node. A gate of the first PMOS transistor serves as a third bias node. A gate of the second NMOS transistor serves as a fourth bias node. A junction of a second source/drain of the first NMOS transistor and a first source/drain of the first PMOS transistor serves as a pull-up node. A junction of a second source/drain of the second PMOS transistor and a first source/drain of the second NMOS transistor serves as a pull-down node. The storage device also includes an input node, a storage node and an output node. The storage node is at a junction of a second source/drain of the first PMOS transistor and a second source/drain of the second NMOS transistor. An input switch controls transmission of a data input signal that can have any of multiple prescribed input signal voltage levels from the input node to a gate of the first NMOS transistor and to a gate of the second PMOS transistor. Limiting circuitry limits the storage node voltage to a prescribed storage node voltage level determined by a most recent data input signal voltage level. An output switch controls transmission from the storage node to the data output node, of a data output signal indicating the determined storage node voltage level.

Another aspect of the invention provides improved dynamic bias circuitry and methods.

These and other features and advantages of the invention will be appreciated from the following detailed description of embodiments of the invention and through reference to the illustrative drawings.

BRIEF DESCRIPTION OF THE DRAWINGS

FIG. 1A is an illustrative circuit diagram of a known integrated circuit data storage cell of the type generally referred to as an SRAM cell. FIGS. 1B–1D are three illustrative circuit diagrams of the known cell of FIG. 1A in a typical SRAM array structure with three different precharge circuitry configurations.

FIG. 2 is an illustrative drawing of an I-V characteristics of a MOS transistor for two different threshold voltages (low Vt and high Vt).

FIG. 3 is an illustrative circuit diagram of an integrated circuit data storage cell in accordance with a first embodiment of the invention.

FIG. 4 is an illustrative timing diagram used to explain the operation of the circuits of FIGS. 3, 5, 9 and 10.

FIG. 5 is an illustrative diagram of an integrated circuit data storage cell in accordance with a second embodiment of the invention.

FIG. 6A is an illustrative drawing of a conventional word line driver circuit that can be used with data storage cell circuitry of embodiments of the present invention.

FIG. 6B is an illustrative drawing of a virtual ground signal applied to the driver of FIG. 6A during active and standby modes of operation.

FIG. 7A is a circuit diagram of a word line driver circuit in accordance with one aspect of the invention.

FIG. 7B is a signal diagram used to explain the operation of the word line driver circuit of FIG. 7A in active and standby modes.

FIG. 8A shows an alternative embodiment of only a bias circuitry portion word line driver circuit in accordance with one aspect of the invention.

FIG. 8B is a signal diagram used to explain the operation of the bias circuitry of FIG. 8A.

FIG. 9 is an illustrative diagram of an integrated circuit data storage cell in accordance with a third embodiment of the invention.

FIG. 10 is an illustrative diagram of multi-state storage circuitry in accordance with a fourth embodiment of the invention.

FIG. 11 is an illustrative drawing of a multi-level sense amplifier that can be used with the embodiment of FIG. 12.

DETAILED DESCRIPTION OF THE PREFERRED EMBODIMENT

The present invention provides novel integrated circuitry that can exhibit high-performance (high-speed) operation in an active mode, can significantly suppress subthreshold leakage current in a standby mode, and can operate with a relatively low (less than 1V) supply voltage. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

FIG. 3 is an illustrative circuit diagram of an integrated circuit data storage cell 20 in accordance with a first embodiment of the invention. The storage cell 20 includes storage circuitry 22, input switch control circuitry 24 which inputs information for storage by the storage circuitry 22 and output switch control circuitry 26 which outputs information stored by the storage cell. The storage circuitry 22 includes transistors M1, M2, M3 and M4. The input switch control circuitry 24 includes input transistor M5. The output switch control circuitry 26 includes output transistors M6 and M7.

The storage circuitry 22 includes a first NMOS transistor M1 with a drain coupled to a supply voltage $V_{DD}$ and also includes a first PMOS transistor M4 with a drain coupled to an effective ground voltage $V_{SS}$. The storage circuitry 22 also includes a second PMOS transistor M2 with a source coupled to the source of the first NMOS transistor M1 and also includes a second NMOS transistor M3 with a source coupled to a source of the first PMOS transistor M4. A junction of the sources of the first NMOS transistor and the first PMOS transistor comprises a pull-up node labeled "A". A junction of the sources of the second NMOS transistor and the second PMOS transistor comprises a pull-down transistor labeled node "B". A gate of the second PMOS transistor M2 is coupled to the supply voltage $V_{DD}$. More specifically, conductor node 27 couples the supply voltage to a gate of PMOS transistor M2 so that the supply voltage biases the gate of M2. A gate of the second NMOS transistor M3 is coupled to the effective ground voltage $V_{SS}$. Moreover, conductor node 29 couples the effective ground voltage to a gate of NMOS transistor M3 so that the effective ground voltage biases the gate of M3. Gates of the first NMOS transistor M1 and the first PMOS transistor M4 are coupled via node 28 to the storage circuitry 22. A drain of the second PMOS transistor M2 and a drain of the second NMOS transistor M3 are coupled to provide a storage node 30. Actually, in a present embodiment, nodes 28 and 30 behave as a single node 28/30 of the storage circuitry 22. In order to store a digital signal value, transistors M1–M4 cooperate to maintain storage node 28/30 at a logic level of the logic value provided on input node 28 during the most recent data write cycle.

The input switch control circuitry 24 includes input transistor M5 with a first source/drain (S/D) terminal coupled to an input node 31 and with a second S/D terminal coupled to node 28/30. In the first embodiment, input node 31 is part of an input signal source comprising a bit line-write (BL-W) conductor line. A gate of transistor M5 is coupled to receive a write control signal. In the first embodiment, the write control signal is referred to as a word line-write (WL-W) signal. In the first embodiment, transistor M5 is an NMOS device.

The output switch control circuitry 26 includes output transistors M6 and M7. A first S/D terminal of M7 is coupled to the effective ground $V_{SS}$, and a second S/D terminal of M7 is coupled to a first S/D terminal of M6. The effective ground serves as a discharge path during reading of logic level 1 signals, as explained below. A second S/D terminal of M6 is coupled to an output node 33. In the first embodiment, the output node 33 is part of a bit line-read (BL-R) conductor line. A gate of transistor M7 is coupled to the storage node 30 of the storage circuitry 22. A gate of transistor M6 is coupled to receive a read control signal. In the first embodiment, the read control signal is referred to as a word line-read (WL-R) signal. In the first embodiment, transistors M6 and M7 are NMOS devices.

Precharge circuitry is coupled to provide a precharge voltage to BL-R. In a present embodiment, precharge circuitry for storage cell 20 includes PMOS transistor 37 with one S/D node coupled to a $V_{DD}$ supply and with another S/D node coupled to the BL-R bit line and with a gate coupled to receive a precharge control signal. Alternatively, an NMOS precharge transistor may be employed. In one embodiment, the precharge control signal is a constant value signal that maintains transistor 37 turned on continuously. In another embodiment, the precharge control signal turns on transistor 37 only during read operations.

It will be understood that in the embodiment of FIG. 3, only one precharge line per storage cell is employed, since only one bit line (BL-R) is used to read stored data. Only one bit line per storage cell (BL-R) has to be precharged to effect a read operation. Thus, less chip area is required and less power is consumed in connection with precharging of bit lines for read operations.

Transistors M1–M4 are preferably depletion transistors or equivalently 'leaky' enhancement transistors. As used herein, the term depletion transistor shall include 'leaky' enhancement transistors. In a present embodiment, M1–M4 are low Vt transistors. A MOS transistor is a depletion transistor if the transistor is turned on even when the gate-to-source voltage (Vgs) is 0V. An NMOS depletion transistor can be produced by implanting n-type impurities in the transistor's channel region such that strong channel conduction can be achieved even with Vgs=0V. Similarly, a PMOS depletion transistor can be produced by implanting p-type impurities in the transistor's channel region such that strong channel conduction can be achieved even with Vgs=0V. A 'leaky' enhancement transistor as the term is used herein means an enhancement transistor having insufficient current driving capability to change the state of a node within a given timing constraint but having a larger current than the junction leakage current of the node. Typically, transistors having very low threshold voltages are depletion transistors while transistors having higher threshold voltages are enhancement transistors.

Transistors M5, M6 and M7 of the first embodiment 20 are 'ordinary' enhancement transistors. M5–M7 have higher threshold voltages than M1–M4. To improve read speed, M6 and M7 are recommended to have lower threshold voltages than M5, although it is not required that M6 and M7 have a lower threshold voltage than M5. As used herein, the term 'ordinary' enhancement transistor means that the transistor is in an off state when a magnitude of a gate-to-source voltage of the transistor is zero.

In operation, during a write cycle, a logical 0 or a logical 1 digital information signal provided on input node 31 and on the BL-W is passed by transistor M5, causing the storage circuitry 22 to store a digital value representing the information signal. During the write cycle, transistor M6 de-couples the storage cell 22 from the output node 33 and BL-R. Following a write cycle, transistors M5 and M6 turn off, isolating node 28/30 from the input node 31 and the output node 33. Following the write cycle, the storage circuitry 22 stores a logic value most recently written from the BL-W line via transistor M5.

In operation, during a read cycle, output transistors M6 and M7 cooperate to effect a signal on the output node 33 and on the BL-R output that is indicative of the logic value currently stored at storage node 28/30 by the storage circuitry 22. Output transistor M6 is turned on during a read cycle. However, the on/off state of the output transistor M7 during a read cycle depends upon the logic level maintained at storage node 28/30 by the storage circuitry 22. More specifically, for example, in one embodiment of the invention when a stored logic level 0 signal is read from node 28/30 of the storage circuitry 22 there is no discharge to ground of a pre-charge voltage on the BL-R bit line through transistor M7 because M7 is turned off due to the provision of a logical 0 signal to its gate by the storage circuitry output terminal. Conversely, for example, when a stored logic level 1 signal is read from node 28/30 the storage circuitry 22 there is a discharge to ground of a pre-charge voltage on output node 33 of the BL-R bit line, through transistor M7, because M7 is turned on due to the provision of a logical 1 signal to its gate by the storage node 28/30.

In the course of the read cycle, a sense amplifier 40 senses whether or not the pre-charge voltage on the BL-R bit line has been discharged through transistors M6 and M7. The sense amplifier receives as inputs a voltage level on output node 33 and BL-R and also receives a reference voltage level $V_{ref}$. The sense amplifier 40 provides an output $D_{out}$ that is indicative of the relative voltage levels on BL-R and $V_{ref}$. If the logic level of the digital information stored by the storage circuitry 22 is logic level 0, then the pre-charge voltage on BL-R will not discharge through transistors M6 and M7. The relative values of $V_{ref}$ and the BL-R line will cause $D_{out}$ to have a first sensed value. Conversely, if the logic level of the digital information stored by the storage circuitry 22 is logic level 1, then the pre-charge voltage on BL-R will discharge through transistors M6 and M7. The relative values of $V_{ref}$ and the BL-R line will cause $D_{out}$ to have a second sensed value.

The $V_{ref}$ level is selected based upon a trade-off between read speed and noise margin. During a read cycle, for example, if $V_{ref}$ is set at $V_{DD}-V_{tn}$, where $V_{tn}$ is NMOS transistor threshold voltage, then only after the voltage level of BL-R drops lower than $V_{DD}-V_{tn}$, will the second value of $D_{out}$ be generated. Alternatively, for example, in order to enhance the read speed, $V_{ref}$ can be set to $V_{DD}-0.1V$. In that alternative case, the read speed would be increased, but the noise margin would be reduced. For example, a MOS diode can be used to select $V_{ref}$ by producing a diode voltage drop between a $V_{DD}$ power line and a $V_{ref}$ line.

FIG. 4 is an illustrative timing diagram used to explain the operation of the circuit of FIG. 3. During time interval T0, the storage circuitry 22 stores a logical 0 value (logic low), the BL-R bit line including the output node 33 is pre-charged to the supply voltage level $V_{DD}$. During time interval T1, a logic 1 value (logic high) is written to the storage circuitry 22. During time interval T2, the stored logic 1 value is read from the storage circuitry 22. During time interval T3, a logic 0 value is written to the storage circuitry 22. During time interval T4, the stored logic 0 value is read from the storage circuitry 22.

More specifically, during time interval T0, BL-W is 0V; WL-W is 0V; and WL-R, including the output node 33, is 0V. BL-R is pre-charged to a voltage level $V_{DD}$. $D_{out}$ is 0V. The voltage at storage terminal 28/30 of the storage circuitry 22 is 0V. The voltage $V_A$ at pull-up node A, the junction of the source terminals of NMOS M1 and PMOS M2, is at a level described below with respect to the description of operation during time interval T3. The voltage $V_B$ at pull-down node B, the junction of the source terminals of NMOS M3 and PMOS M4, is at 0V.

During time interval T1, a write cycle writes logic level 1 (high) data into the storage circuitry 22. During the write cycle, the BL-R line can be floating, although it is shown to be at $V_{DD}$ in the voltage timing diagram of FIG. 4. The WL-R control signal provided to the gate of M6 is at a logic 0 (low) level, turning off M6, thereby de-coupling and electrically isolating the BL-R bit line output, and the output node 33, from the storage node 28/30. The BL-W bit line, including input node 31, provides a logic 1 (high) signal at a voltage level $V_{DD}$. The WL-W control signal provided to the gate of M5 is high so as to turn on M5.

In a present embodiment, when M5 is turned on, the input voltage level at input node 31 is communicated to the gate of NMOS transistor M1 and to the gate of PMOS transistor M4. Also, in a present embodiment, when M5 is turned on, the input voltage level at input node 31 is communicated to storage node 28/30. In one embodiment, M5 is an ordinary enhancement transistor, and the peak voltage of the WL-W control signal is $HV_{DD}$ which is a voltage boosted one threshold voltage above $V_{DD}$ so that the voltage level provided at input node 28 can be full $V_{DD}$. However, a voltage level of $V_{DD}$ can be used as the WL-W control signal turn on voltage level if M5 is implemented as a depletion mode transistor or as a leaky enhancement transistor.

It will be appreciated that even if M5 is an ordinary enhancement transistor, if M1–M4 are depletion transistors, the voltage level of node 28/30 is pulled up to $V_{DD}$ due to a self-regeneration (self-latch) operation. If M1–M4 are self-regenerative, HVdd is not actually needed. Nevertheless, HVdd ordinarily is desirable in order to transfer to full Vdd from the write bit line (BL-W) to node 28/30. In one alternative embodiment, transistor M5 is implemented as a depletion mode device or as a leaky enhancement device.

With the provision of a logic 1 value input to the gate of NMOS M1, M1 turns on. Initially, the sources of M1 and M2 interconnected at pull-up node A are at the voltage level $V_A$. The voltage at node A rises to $V_{DD}$ without any voltage drop since M1 is a depletion NMOS transistor. This is also true if M1 is a leaky enhancement transistor. Since the gate of PMOS M2 is coupled to the $V_{DD}$ supply voltage, and its source is coupled to node A, also at $V_{DD}$, the source-to-gate (Vgs) voltage of M2 is 0V. Since PMOS M2 is a depletion PMOS transistor, and Vgs is 0V, there is a conduction path from pull-up node A to the storage node 28/30. This is also the case when M2 is a leaky enhancement transistor. Therefore, the full supply voltage bias level $V_{DD}$ is transferred to the storage node 28/30. Even after the WL-W control signal goes to low (0 V), and turns off transistor M5, the voltage at the storage node 28/30 is maintained at $V_{DD}$, maintaining the stored logical 1 level data state.

Also, with the provision of a logic level 1 value to the gate of PMOS transistor M4, M4 is strongly turned off since its Vgs (voltage between its gate and source) is ($V_{DD}$). At the start of time interval T1, the gate of NMOS M3 is coupled to the effective ground voltage bias level $V_{SS}$ while the pull-down node B voltage is at $V_{SS}$ (0V in one embodiment). Thus, M3 turns on since the gate-to-source (Vgs) of M3 is Vss (0V in one embodiment), M4 is strongly turned off (reverse biased), and the leakage current flowing through M4 is smaller than that of M3. Specifically, since M3 is a depletion NMOS transistor with Vgs=0V, there is a conduction path between storage node 28/30 and node B. Consequently, leakage current flows through M3 until a voltage at node B rises to a level of $V_B<V_{DD}$ at which NMOS M3 is self-reverse biased shutting off the leakage current, whereupon both M3 and M4 both are reversed biased and leakage current is significantly suppressed. When the voltage of node B is $V_B$, the Vgs of M4 is ($V_{DD}-V_B$), and the Vgs of M3 is $-V_B$. Therefore, $V_B$ represents a steady-state voltage of node B when the stored data value stored at storage node 28/30 is logic level 1 (high).

The value of $V_B$ at which M3 becomes self-reverse biased depends on the relative channel conduction strengths of M3 and M4, and can be calculated using Kirchoff's law at pull-down node B. For example, if the channel conductance of M4 was reduced, then the value of $V_B$ at the point where M3 would become reverse biased also would be increased since more voltage would drop across M4.

Thus, the leakage current from the storage node 28/30 to ground through M3 and M4 can be suppressed to a negligible level. By proper sizing of transistors M3 and M4, node B voltage $V_B$ can be controlled to suppress the standby leakage current for logic level 1 (high) data storage. More specifically, the voltage $V_B$ of node B is determined by the ratio of leakage current flowing through M3 and M4. In general, there is an optimum ratio to minimize leakage current. For instance, decreasing the size of M3 relative to the size of M4 decreases the conductance of M3 relative to the conductance of M4 which can lower the level of $V_B$ at which M3 becomes reverse biased when storing a logic level 1 value by some amount $\Delta V_B$. One result of such decreased relative size of M3 is that during storage of a logic level 1 value, M4 is more highly reversed biased by an amount $\Delta V_B$ while M3 is less highly reverse based by the same amount $\Delta V_B$. There should be an optimum condition (i.e. an optimum value of $V_B$) at which the degree of reverse biasing of M3 and M4 minimizes leakage current. This optimum level can be set by appropriate relative sizing of M3 and M4.

Therefore, during time interval T1, a logic level 1 value is written into the storage circuitry 22. The logic level 1 (high) input on BL-W turns on the depletion NMOS M1 and turns off the depletion PMOS M4. The voltage VA rises to a level at which $V_{sg}$ of depletion PMOS transistor M2 is 0V, causing M2 to conduct the full supply voltage to the storage node 28/30. The voltage $V_B$ rises to a level at which depletion NMOS M3 transistor becomes self-reverse biased. With transistors M1 and M2 turned on and transistors M3 and M4 turned off, the voltage of storage node 28/30 is, in effect, 'pulled up' through pull-up node A to the supply voltage bias level. Thus, in a present embodiment, the full supply voltage is provided to maintain the stored logic level 1 signal while leakage current is suppressed through reverse bias of both NMOS M3 and PMOS M4.

During time interval T2, a read cycle reads the stored high logic level (logic 1) signal from the storage circuitry 22. In the example illustrated in FIG. 4, the BL-W bit line, including input node 31, provides a logic level 0 (low) signal, although the signal level on BL-W is unimportant during the read cycle and thus, BL-W can be floating during read operation. The WL-W control signal provided to the gate of M5 is low so as to turn off NMOS transistor M5, thereby electrically isolating the input node 28/30 from the BL-W input. The WL-R control signal is at a logical 1 (high) level causing NMOS transistor M6 to turn on. The voltage level applied to the gate of NMOS transistor M7 is the voltage level representing the data stored by the storage circuitry 22. Specifically, the voltage level of storage node 28/30 is applied to the gate of M7.

In the example of FIG. 4, during time interval T2, the stored data is represented by a logic level 1 (high) voltage, and M7 is turned on due to the stored logic level high data. Throughout the read cycle, the voltage levels $V_A$ at pull-up node A and $V_B$ at pull-down node B are maintained at levels consistent with the storage of a logic level 1 (high) at storage node 28/30. During the read cycle, however, the voltage level on the BL-R bit line, including the output node 33, drops from the pre-charge level to a lower voltage level, for example, $V_{SS}$.

At the beginning of time interval T2 when the read cycle begins, the BL-R, including output node 33, bit line is at a pre-charge voltage level, which is $V_{DD}$ in the illustrated embodiment. During the read cycle, the pre-charge voltage on BL-R, including output node 33, discharges to the effective ground level $V_{SS}$ through M6 and M7. In response to such discharge, the $D_{out}$ output of the sense amplifier 40 changes from low to high, the second $D_{out}$ value, indicating a read of a logic level 1 (high) value from storage node 28/30.

More particularly, M6 and M7 cooperate in the reading of stored information from the storage circuitry 22. Transistor M6 functions to determine when a read cycle is to occur. When the WL-R control signal is low, M6 is turned off, and M7 and the storage circuitry 22 are isolated from the BL-R output. When the WL-R control signal is high, as during time interval T2, M6 is turned on, and M7 and the storage circuitry 22 are coupled to the BL-R output. Transistor M7 functions to determine whether or not the pre-charge voltage on BL-R will discharge through M6 and M7 during a read cycle. When M7 is in a turned on state during a read cycle, the pre-charge voltage discharges, and when M7 is in a turned off state during a read cycle, the pre-charge voltage does not discharge. The on/off state of M7 is controlled by the voltage level of storage node 28/30 of the storage circuitry 22. If the voltage level maintained by the storage circuitry 22 at storage node 28/30 is low (logic level 0), then M7 is turned off. If the voltage level maintained by the storage circuitry 22 at storage node 28/30 is high (logic level 1) as during time interval T2, then M7 is turned on.

During the read cycle of time interval T2, both M6 and M7 are turned on. The pre-charge voltage on the BL-R bit line output discharges through M6 and M7. The sense amplifier 40 senses the change in the voltage level on the BL-R bit line, including output node 33, and provides a $D_{out}$ signal having a second value that is indicative of storage of a high logic level signal by the storage circuitry.

In a present embodiment of the invention, the on/off state of M7 is determined by the voltage level maintained by the storage circuitry 22. Transistor M7 in essence serves as an output circuit for the storage circuitry 22 during the read cycle. The on/off state of M7 is indicative of the voltage level maintained by the storage circuitry 22. If M7 is turned on, then a high level is stored. If M7 is turned off, then a low level is stored. Thus, transistor M7 functions to make connection of a voltage discharge path for the BL-R bit line, and output node 33, dependent upon the logic level stored at the storage node 28/30 of the storage circuitry 22.

In general, when M6 is turned on and the storage node voltage is low, transistor M7 communicates the low storage node voltage to output node 33 by preventing discharge of the pre-charge voltage on output node 33. Conversely, when M6 is turned on and the storage node voltage is high, transistor M7 communicates the high storage node voltage by permitting discharge of the pre-charge voltage from output node 33 to effective ground.

The first embodiment of FIG. 3 uses separate read paths and write paths. Specifically, data is written via transistor M5. Data is read via transistors M7 and M8. As explained above, the separate write and read paths promote improved circuit stability. Larger size transistors, with large current carrying capability, can be used to implement M7 and M8 so as to increase read speed. Alternatively, low Vt transistors can be used-to implement M7 and M8 to increase read speed.

During time interval T3, a write cycle writes logic level 0 (low) data into the storage circuitry 22. In the example illustrated in FIG. 4, the BL-R bit line is pre-charged to the $V_{DD}$ supply bias voltage level, although the voltage level on BL-R is unimportant during the write cycle and thus, BL-R can be floating during the read operation. The WL-R control signal provided to the gate of M6 is at al logic 0 (low) turning off M6, thereby de-coupling and electrically isolating the BL-R bit line, and output node 33, from the storage node 28/30. The BL-W bit line, including input node 31, provides logic 0 (low) signal at a voltage level 0V. The WL-W control signal provided to the gate of M5 is high so as to turn on M5. As explained above with reference to write cycle T1, the peak voltage of the WL-W control signal preferably is $HV_{DD}$ so that the voltage level communicated to node 28/30 will be full $V_{DD}$.

With the provision of a logic 0 value input to the gate of PMOS M4, M4 turns on. The sources of M3 and M4 interconnected at pull-down node B initially are voltage level $V_B$, since a high logic level signal previously had been maintained at storage node 28/30. However, since the gate of depletion PMOS transistor M4 receives 0V input, the voltage of pull-down node B drops to the effective ground bias voltage level during time interval T3. This is also true if M4 is a leaky enhancement transistor. Since the gate of NMOS M3 is coupled to the effective ground bias voltage $V_{SS}$, the gate-to-source (Vgs) voltage of M3 is 0V. Since NMOS M3 is a depletion NMOS transistor, and Vgs is 0V, there is a conduction path from the storage node 28/30 to pull-down node B. This is also the case when M3 is a leaky enhancement transistor. Therefore, the storage node 28/30 is coupled to effective ground bias voltage. Even after the WL-W control signal goes to low (0 V), and turns off transistor M5, the voltage at the storage terminal 28/30 is maintained at the effective ground bias voltage $V_{SS}$, maintaining the stored logical 0 level data state.

Also, with the provision of a logical 0 value to the gate of NMOS transistor M1, M1 turns off. Specifically, for example, if $V_{SS}$=0V is applied to the gate of M1 while the voltage at pull-up node A is at $V_{DD}$, then Vgs of M1 is $-V_{DD}$, causing M1 to be strongly turned off. Meanwhile, initially the Vgs of M2 is 0V since the gate of M2 is coupled to receive $V_{DD}$ and the source of M2 is coupled to pull-up node A which initially is at voltage level $V_{DD}$. Since M1 is strongly turned off (reversed biased), the leakage current flowing through M1 is smaller than that flowing through M2. More particularly, PMOS transistor M2 turns on since it is a depletion (or alternatively a 'leaky enhancement') transistor with a source-to-gate (Vsg) voltage of 0V. Thus, there is a conduction path, through M2, from pull-up node A to the storage node 28/30. When the voltage of pull-up node A is $V_A$, the Vgs of M1 is $-V_A$ (assuming $V_{ss}$=0V), and the Vgs of M2 becomes ($V_{DD}-V_A$). Leakage current flows through M2 until $V_A$ achieves a steady-state level at which both transistors M1 and M2 are sufficiently reverse-biased to suppress further leakage current. Therefore $V_A$ represents a steady-state voltage level at pull-up node A when a logic level 0 (low) value is stored by the storage circuitry 22. Basically, leakage current flows through M2 until a voltage at pull-up node A falls to a level of $V_A < V_{DD}$ at which PMOS M2 is self-reverse biased shutting off the leakage current, whereupon both M1 and M2 are reversed biased.

The value of $V_A$ at which M2 becomes self-reverse biased depends on the relative channel conduction strengths of M1 and M2, and can be calculated using Kirchoff's law at node A. For example, if the channel conductance of M2 was reduced relative to the channel conductance of M1, then the value of $V_A$ at the point where M2 would become reverse biased also would be increased since more voltage would drop across M2.

Thus, the leakage current from the supply bias voltage $V_{DD}$ to the storage node 28/30 through M1 and M2 can be suppressed to a negligible level. By proper sizing of transistors M1 and M2, pull-up node A voltage $V_A$ can be controlled to suppress the standby leakage current for logic level 0 (low) data storage. More specifically, the voltage $V_A$ of pull-up node A is determined by the ratio of leakage current flowing through M1 and M2. In general, there is an optimum ratio to minimize leakage current. For instance, decreasing the size of M1 relative to the size of M2 decreases the conductance of M1 relative to the conductance of M2 which can lower the level of $V_A$ at which M2 becomes reverse biased when storing a logic level 0 value by some amount $\Delta V_A$. One result of such decreased relative size of M1 is that during storage of a logic level 0 value, M2 is more highly reversed biased by an amount $\Delta V_A$ while M1 is less highly reverse based by the same amount $\Delta V_A$. There should be an optimum condition (i.e. an optimum value of $V_A$) at which the degree of reverse biasing of M1 and M2 minimizes leakage current. This optimum level can be set by appropriate relative sizing of M1 and M2.

Therefore, during time interval T3, a logic level 0 value is stored. The logic level 0 (low) input on BL-W, and input node 31, turns on the depletion PMOS transistor M4 and turns off the depletion NMOS transistor M1. The voltage at pull-up node A falls to a voltage level $V_A$ at which depletion PMOS transistor M2 becomes reverse biased and turns off. The voltage at pull-down node B falls to a level of 0V, and depletion NMOS transistor M3 is turned on. With transistors M1 and M2 turned off and transistors M3 and M4 turned on, the voltage of storage node 23/30 is, in effect, 'pulled down' through pull-down node B to the effective ground voltage bias level. Thus, in a present embodiment, storage node 28/30 is coupled to effective ground bias voltage which serves to maintain the stored logic level 0 signal, while leakage current is suppressed through reverse bias of both NMOS M1 and PMOS M2.

During time interval T4, a read cycle reads the logic level 0 (low) data that is stored by the storage circuitry 22. In the example illustrated in FIG. 4, the BL-W bit line, and input node 31, provide a logic level 0 (low) signal, although the BL-W control signal level on BL-W is unimportant during the read cycle. The WL-W control signal provided to the gate of M5 is low so as to turn off NMOS transistor M5, thereby electrically isolating the storage node 28/30 from the BL-W input. The WL-R control signal is at a logical 1 (high) level causing NMOS transistor M6 to turn on. The voltage level applied to the gate of NMOS transistor M7 is the voltage level representing the data stored by the storage circuitry 22. Specifically, the voltage level of storage node 28/30 is applied to the gate of M7.

In the example of FIG. 4, during time interval T4, the stored data is represented by a logic level 0 (low) voltage, and M7 is turned off due to the stored logic level low data. Throughout the read cycle, the voltage levels $V_A$ at pull-up node A and $V_B$ at pull-down node B are maintained at levels consistent with the storage of a logic level 0 (low) at storage node 28/30. Also, during the read cycle, the voltage level on the BL-R bit line, and on output node 33, does not change and remains at the pre-charge voltage level, $V_{DD}$.

As explained above, M6 and M7 cooperate in the reading of stored information from the storage circuitry 22. During time the read cycle of time interval T4, transistor M6 is turned on, and transistor M7 is turned off. Therefore, transistor M7 functions to block discharge of the pre-charge voltage $V_{DD}$ on the BL-R bit line. The sense amplifier senses no change in the voltage level on the BL-R bit line and, and output node 33, provides a $D_{out}$ signal having a first value that is indicative of storage of a low logic level signal by the storage circuitry 22.

FIG. 5 is an illustrative circuit diagram of a second embodiment of the invention. Components of the seventh embodiment that correspond to identical components of the embodiment of FIG. 3 are identified by primed reference numerals identical to the numerals used to identify corresponding components in FIG. 3. The embodiment of FIGS.

3 and 5 are quite similar, and for that reason, only aspects of the seventh embodiment that are different shall be described.

Basically, the difference between the embodiment of FIG. 3 and that of FIG. 5 is that transistors M5, M6 and M7 in FIG. 5 are depletion type, or alternatively, leaky enhancement type. Whereas, the corresponding transistors of FIG. 3 are ordinary enhancement type devices. An advantage of the use of depletion (or leaky enhancement) transistors as input (M5) and output (M6, M7) devices is avoidance of the use of a boosted voltage $HV_{DD}$ like that of the embodiment of FIG. 3, reduction of the number of different types of transistors (in this case, all transistors can be implemented with only depletion transistors), and improved read speed.

More particularly, in the embodiment of FIG. 3, in order to transfer the data from BL-W, including input node 31, to the storage node, 28/30, with unwanted voltage degradation, a boosted voltage, $HV_{DD}$, is employed. However, in the embodiment of FIG. 5, transistor M5 is implemented as a depletion (or leaky enhancement) transistor and such boosted voltage is not called for. As a result, a special circuit to generate a boosted voltage is not needed, and unnecessary power consumption for the circuit can be eliminated. One disadvantage of the boosted voltage used in the embodiment of FIG. 3 is that this voltage is maintained in a standby mode, and can be another source of static power consumption. Also, by implementing M6 and M7 as depletion transistors, the read speed can be improved due to increased current driving capability for the same input voltage. Basically, since depletion transistors M6, M7 have lower threshold voltages, for the same input voltage, the current driving capability is much larger than that of ordinary enhancement transistors for which the threshold voltage is larger.

One challenge confronted with the use of depletion or leaky enhancement device as an input transistor M5 is that a depletion device turns on when $V_{gs}$=0.0V. Thus, when M5 is implemented as a depletion (or leaky enhancement transistor), it is desirable to pull the gate voltage of M5 below 0.0V to ensure turn off of M5 strongly.

The first S/D of M7 is coupled to $V_{ref1}$ which is higher than Vss by Vt of enhancement transistor. So, even though stored data is low, M7 is turned off and BL-bar level is not discharged. But when stored data is high, BL-bar level can be discharged faster due to increased current driving capability of M6 and M7.

FIG. 6A is an illustrative drawing of a conventional word line driver circuit 50 that can be used with data storage cell circuitry of embodiments of the present invention. FIG. 6B is an illustrative drawing of a virtual ground signal applied to the driver of FIG. 6A during active and standby modes of operation. In order to fully turn off transistor M5 of FIG. 3, for example, or to suppress leakage current through M5, it is desirable to pull down the voltage on a word line (WL) to a lower level in a standby mode than in an active mode. FIG. 6A shows a driver circuit 50 comprising an inverter 52 with a PMOS transistor 54 and an NMOS transistor 56. A first S/D of the PMOS device 54 is coupled to a $V_{DD}$ supply voltage. A second S/D of the PMOS device 54 and a first S/D of the NMOS device 56 are coupled to a data node 58 that is coupled to the WL. A second S/D of the NMOS 56 device is coupled to a virtual ground node 60. The gates of the PMOS and NMOS transistors 54, 56 are coupled to an address node 62 which provides address information. In operation, the address information provided to the address node 62 determines the logic level of a signal driven on to WWL by the inverter.

FIG. 6B shows that a signal φLVSS provided to the virtual ground node 60 is set to $V_{SS}$ during active mode operation and is set to $V_{SS}-\Delta V$ during standby mode operation. One advantage to this scheme is that a lower ground voltage can be used during standby mode operation without imparting a speed penalty during active mode operation. One shortcoming with the driver circuit of FIGS. 6A–6B is that signal φLVSS has limited current driving capability since it is a generated signal rather than a supply such as $V_{SS}$, for example. Due to this limited current driving capability, the virtual ground node 60 has a more limited ability to discharge current over a given period of time. During active mode operation, for instance, it is desirable to shut down a word line quickly in order to reduce overall cycle time. The limited driving capability of signal φLVSS can cause delay in discharge of a word line, thereby increasing overall cycle time. In this example, cycle time is the sum of the active cycle time to enable a word line to perform a given function (e.g., read or write) and the precharge time to disable the word line and set circuits ready for the next operation.

FIG. 7A is a circuit diagram of an alternative embodiment word line write driver circuit 400. FIG. 7B is a signal diagram used to explain the operation of the alternative word line driver 400 both in active and standby modes. The word line driver 400 includes a driver section 402 used to drive the WL control line. The word line driver 400 includes bias circuitry 404 used to regulate a low voltage level provided via WL control line to the gate of write access transistor M5.

The driver section 402 includes a PMOS transistor 406 and a first NMOS transistor 408 having respective S/D junctions coupled to form an inverter. An address signal is provided to a driver input node 410. A WL control signal is provided to WL via a driver output node 412. One S/D node of PMOS transistor 406 is coupled to a $V_{DD}$ Supply bias voltage source. One S/D node of NMOS transistor 408 is coupled to a virtual ground (LVGND) bias voltage node 414.

The bias circuitry 404 includes first and second NMOS transistors M11 and M12. Transistors M11 and M12 control the voltage level on the LVGND node. One S/D node of M11 is coupled to the LVGND node, and another S/D node of M11 is coupled to $V_{SS}$ supply bias voltage source. A gate of M11 is coupled to receive a first mode control signal φLV$_{SS}$ provided on a first mode control node 416. One S/D node of M12 is coupled to the LVGND node, and another S/D node of M12 is coupled to receive the first mode control signal φLV$_{SS}$ provided the first mode control node 416. A gate of M12 also is coupled to receive a second mode control signal φSTD (standby) provided on a second mode control node 418.

FIG. 7B shows that in an active mode of operation, first node control signal φLV$_{SS}$ is high, and second node control signal φSTD is low. As a result, M11 is turned on, and M12 is turned off. The virtual ground bias at the LVGND node is the $V_{SS}$ voltage level. During active mode operation, when the second NMOS transistor M11 is turned on and the third NMOS transistor M12 is turned off, the virtual ground node 414 is coupled the $V_{ss}$ supply voltage. As a result, there is current discharge capability is enhanced, and performance degradation is reduced. The discharge capability can be further enhanced by ensuring that the second NMOS transistor M11 is large enough to carry a desired discharge current level and by ensuring that its gate is driven by a voltage somewhat larger than $V_{DD}$. FIG. 7B shows that in a standby mode of operation, first node control signal φLV$_{SS}$ goes below VSS, $V_{SS}-\Delta V$, and φSTD is high. As a result, M11 is turned off and M12 is turned on. The virtual ground at the LVGND node is $V_{SS}-\Delta V$. The value of $\Delta V$ is a voltage sufficient to turn off M5 strongly when M5 is a depletion transistor.

FIG. 8A shows another alternative embodiment showing only a bias circuitry portion 500 of a word line write driver circuit that can be used to drive a word line control coupled to the gate of M5. One will appreciate that the driver portion (not shown) can be identical to that described with reference to FIG. 7A. FIG. 8B is a signal diagram used to explain the operation of the bias circuitry 500.

The bias circuitry 500 includes NMOS transistors 502 and 504. One S/D node of transistor 502 is coupled to the LVGND node, and another S/D node of transistor 502 is coupled to $V_{SS}$ supply voltage. A gate of transistor 502 is coupled to receive a first mode control signal $\phi_{active}$ provided to a first node control node, i.e., the gate of device 502. One S/D node of transistor 504 is coupled to a virtual ground node (LVGND), and another S/D node of transistor 504 is coupled to the virtual ground node. A gate of transistor 504 is coupled to receive a second mode control signal $\phi_{standby}$ signal provided to a second node control node, i.e., the gate of device 504.

FIG. 8B shows that in an active mode, the $\phi_{active}$ signal is $HV_{DD}$ ($V_{DD}+\Delta V_1$), and the $\phi LV_{SS}$ signal is $V_{SS}-\Delta V_3$. As a result, in an active node transistor 502 is turned on, transistor 504 is turned off, and the virtual ground node is at VSS. Thus, there is a discharge path via supply voltage $V_{SS}$. Conversely, in a standby mode, the $\phi_{active}$ signal is $LV_{SS}$ ($V_{SS}-\Delta V_2$), and the $\phi LV_{SS}$ signal is $V_{SS}-\Delta V_1$ when $\phi_{standby}$ is Vdd. As a result, transistor 502 is turned off, transistor 504 is turned on, and the virtual ground node is at $V_{SS}-\Delta V_1$.

The extra-low voltage $LV_{SS}$ can be produced by on-chip or external negative voltage generator. The generation of the boosted and reduced voltages are well known to persons skilled in the art, form no part of the present invention, and therefore, are not described herein.

Alternatively, for example, M5 can be implemented as an ordinary enhancement type transistor with a high threshold voltage Vt which can obviate a need for the circuits of FIGS. 6A, 7A or 8A. In such alternative configuration, M6 and M7 can be implemented with low Vt enhancement transistors to improve the read speed without the requirement of $V_{ref1}$.

FIG. 9 is an illustrative circuit diagram of a third embodiment of the invention. Components of the third embodiment that correspond to identical components of the embodiment of FIG. 3 are identified by double primed reference numerals identical to the numerals used to identify corresponding components in FIG. 3. The embodiment of FIGS. 3 and 9 are quite similar, and for that reason, only aspects of the eighth embodiment that are different shall be described.

The gates of M2 and M3 are coupled to receive a reference voltage $V_{refx}$. As a result, the gates of M2 and M3 are maintained at the same voltage potential. They are at equipotential with respect to each other. A value of $V_{refx}$ is selected to cause M2 to turn on more strongly when a high level (logic 1) voltage is stored by the storage circuitry 22". The value Of $V_{refx}$ is selected so as to also cause M3 to turn on more strongly when a low level (logic 0) voltage is stored by the storage circuitry 22". An advantage of turning on M2 more strongly during storage of a high level voltage and of turning on M3 more strongly during storage of a low level voltage is improved noise immunity. A data value stored at node 28/30" can be maintained more safely against possible electrical noise that otherwise might more easily cause discharge or loss of a stored voltage level.

Another purpose of using $V_{refx}$ is to control the $V_A$ or $V_B$. As explained earlier, by changing the transistor sizes, $V_A$ and $V_B$ can be controlled. But in memory cell design, for example, it may be impractical, technically or economically, to change transistor sizes, to adjust $V_A$ or $V_B$, since memory cells typically are repeated many times in an integrated circuit memory. In other words, a seemingly small change in transistor sizes can significantly alter the overall chip. For that reason, it may be more desirable to control $V_A$ and $V_B$ by changing a $V_{refx}$ voltage level rather than by adjusting transistor sizes.

For example, assume that $V_{refx}$ is selected to be $\frac{1}{2}V_{DD}$. During a low-to-high transition such as that illustrated in time interval T1 of the timing diagram of FIG. 4, M1 turns on. The gate voltage of M2 is $\frac{1}{2}V_{DD}$, and the initial source voltage of M2 is $V_{DD}$. Thus, the $V_{gs}$ of M2 is $-\frac{1}{2}V_{DD}$, and M2 turns on. Due to the higher magnitude gate voltage ($V_{refx}=\frac{1}{2}V_{DD}$), M2 of FIG. 9 turns on more strongly during T1 than does M2 of FIG. 3 and thereby provides improved noise immunity.

Also, during a low-to-high transition, as in T1 but with $V_{refx}=\frac{1}{2}V_{DD}$, transistors M3 and M4 become self reverse biased. In such self reverse biased state, the Vgs of M3 becomes $\frac{1}{2}V_{DD}-V_B$, and the $V_{gs}$ of M4 becomes $V_{DD}-V_B$. It will be appreciated that the value of $V_{refx}$ controls the value of $V_B$ at which the $V_{gs}$ of M3 and the Vgs of M4 cause both M3 and M4 to become reverse biased.

During a high-to-low transition like that of time interval T3 with $V_{ref1}=\frac{1}{2}V_{DD}$, M4 turns on, and the voltage at pull-down node B drops to $V_{SS}$. Whereupon, the source voltage of M3 also drops to $V_{SS}$. Assuming that $V_{SS}=0V$ the Vgs of M3 becomes $\frac{1}{2}V_{DD}$, and M3 turns on. Because of the higher magnitude gate voltage ($V_{refx}=\frac{1}{2}V_{DD}$), M3 of FIG. 9 turns on more strongly during T3 than does M3 of FIG. 3 and thereby provides improved noise immunity.

Also, during a high-to-low transition, as in T3 but with $V_{refx}=\frac{1}{2}V_{DD}$, transistors M1 and M2 become self reverse biased. In such self reverse biased state, the Vgs of M1 becomes $-V_A$ (assuming $V_{SS}=0V$), and the Vgs of M2 becomes $\frac{1}{2}V_{DD}-V_A$. It will be understood that the value of $V_{refx}$ controls the value of $V_A$ at which the $V_{gs}$ of M1 and the $V_{gs}$ of M2 cause both M1 and M2 to become reverse biased.

From the foregoing, persons skilled in the art will appreciate that a value of $V_{refx}$ can be selected and relative sizing of M1 and M2 and of M3 and M4 can be provided so as to provide sufficient noise immunity during active state operation while also achieving a sufficient self reverse bias effect to suppress leakage current. Also, $V_{refx}$ can be used to dynamically control the node voltages $V_A$ and $V_B$ during self-reverse bias conditions. Adjusting the value Of $V_{refx}$ can be used to adjust the values of $V_A$ and $V_B$ during reverse bias conditions.

FIG. 10 is an illustrative schematic diagram of a multi-state storage circuit in accordance with a fourth embodiment of the invention. Components of the multi-state storage circuit embodiment that correspond to identical components of the embodiment of FIG. 3 are identified by triple primed reference numerals identical to the numerals used to identify corresponding components in FIG. 3. The embodiment of FIGS. 3 and 10 are quite similar, and for that reason, only aspects of the multi-state storage circuit that are different shall be described.

The multi-state storage circuitry 50 can store data at multiple voltage levels, and each voltage level represents a different logical state. Each voltage level serves as a steady-state level which can be sensed using level sensing circuitry, such as that described below with reference to FIG. 11. In one embodiment, data can be stored at four different voltage levels, each representing a different logic state. The following table provides and illustrative example of correspondence between data storage voltage levels and logical states.

Multi-State Storage Example

| Data Storage Voltage Level | Logical State |
|---|---|
| 0.0 V | 00 |
| 0.6 V | 01 |
| 1.2 V | 10 |
| 1.8 V | 11 |

Transistor M8 enables the storage of multiple different voltage levels, each representing a different logical state. In one embodiment, M8 comprises an NMOS transistor with a source coupled to input node 28/30''', with a drain coupled to the gate of transistor M1, and with a gate coupled to pull-down node B. As explained above, the source of M3 and the source of M4 are coupled at pull-down node B.

Thus, the source of M8 receives an input voltage level $V_{in}$ at node 28/30''', and the gate of M8 receives a pull-down node B voltage level $V_B$. In one embodiment, M8 comprises a depletion device that applies an input voltage $V_{in}$ to the gate of M1 when Vgs of M8 is greater than or equal to 0.0V. However, alternatively, M8 can be implemented as a leaky enhancement transistor or as an ordinary transistor. Different M8 transistor types lead to the provision of different voltage levels to the gate of M1. When M8 is a depletion transistor, an input voltage without any voltage drop can be applied to the gate of M1 since the M8 threshold voltage is 0V. When M8 is an ordinary transistor, the input voltage dropped voltage by the M8 threshold voltage of the ordinary transistor will be applied to the gate of the M1. Therefore, even though the operation of the circuit is explained based on depletion transistors it is important to note that other types of transistors can be used.

A role of M8 is to control the voltage applied to the gate of M1 as a function of the voltage of node B which is set by the applied (written) voltage to the cell. For example, the voltage of $V_B$ is different for different written data (voltages). The voltage applied to the gate of M1 is adjustable and dependent upon the most recently input voltage provided to node 28/30'''.

In a present embodiment, essentially, the gate of M1 is coupled to storage node 28/30''' through transistor M8. When M8 is turned on, the gate of M1 is coupled to node 28/30'''. Thus, the voltage applied to the gate of M1 is determined by the voltage of $V_B$ minus the threshold voltage of M8.

In operation, assuming the above example voltages, any one of the four example voltages can be applied to the gate of M4 as $V_{in}$. Each of the four input signal voltage levels corresponds to different digital logic information that can be stored as indicated in the above chart. An input voltage $V_{in}$=0.0V turns on M4. An input voltage $V_{in}$=0.6V turns off M4. An input voltage $V_{in}$=1.2V turns off M4. An input voltage $V_{in}$=1.8V turns off M4.

M3 is depletion (or leaky enhancement) transistor that turns on when its Vgs is greater than or equal to 0.0V. In the embodiment of FIG. 10, the gate of M3 is coupled to effective ground $V_{SS}$, which is 0.0V. Therefore, M3 is turned on for each of the four example voltage levels.

For $V_{in}$=0.0V, M4 is turned on and $V_B$ becomes 0.0V the current path through M3 and M4 causes $V_B$ to drop to 0.0V. M8 turns on when $V_B$ falls to 0.0V since at that point, $V_B-V_{in}$=0.0V. Whereupon, the input voltage level $V_{in}$=0.0V is applied to the gate of M1. Therefore, the voltage at the source node of M1 is 0.0V.

For input voltages of Vin=0.6V, 1.2V or 1.8V, M3 is turned on while M4 is turned off. For each of these input voltages, a leakage current through M3 results in a build up of charge at node B. When the voltage at pull-down node B reaches a level $V_B$ at which $V_B-V_{in}$ is greater than or equal to 0.0V, M8 turns on.

For $V_{in}$=0.0V, M8 turns on when $V_B$=V0. For $V_{in}$=0.6V, M8 turns on when $V_B$=V1. For $V_{in}$=1.2V, M8 turns on for $V_B$=V2. For $V_{in}$=1.8V, M8 turns on for $V_B$=V3.

Transistor M8 clamps the voltage level stored at node 28/30''' to the input voltage level $V_{in}$ as follows. When M8 turns on with $V_{in}$=0.0V, M1 turns on. M2 also turns on since it has $V_{DD}$ applied to its gate and $V_{DD}$ applied to its source giving it a Vgs of 0.0V. The level of node B ($V_B$) is set at V0 (e.g. 0, 0V) according to the bias condition and transistor sizes of M3 and M4. However, if current conduction through M1 and M2 causes $V_{in}$ to begin to rise above 0.0V, M8 will turn off since its Vgs=$V_B-V_{in}$ no longer will be greater than or equal to 0.0V. Thus, when Vin=0.0V, M8, M1 and M2 cooperate to clamp the voltage at node 28/30''' to 0.0V even after transistor M5 is turned off and the storage circuitry 50 is electrically isolated from the BL-W bit line.

Similarly, when M8 turns on with $V_{in}$=0.6V, M1 and M2 turn on. The level of node B ($V_B$) is set at V1 according to the bias condition and transistor sizes of M3 and M4. However, if current conduction through M1 and M2 causes $V_{in}$ to begin to rise above the voltage set by this condition, M8 will turn off since its $V_{gs}$ no longer will be greater than or equal to 0.0V. Thus, when $V_{in}$=0.6V, M8, M1 and M2 cooperate to clamp the voltage at node 28/30''' to V1.

Likewise, when M8 turns on with $V_{in}$=1.2V, M1 and M2 turn on. The level of pull-down node B, $V_B$, is set at V2 according to the bias condition and transistor sizes of M3 and M4. For $V_{in}$=1.2V, the newly set voltage level of node B is higher than that set by $V_{in}$=0.6V due to reduced channel conductance of M4 for higher applied voltage. However, if current conduction through M1 and M2 causes $V_{in}$ to begin to rise above V2, M8 will turn off since its $V_{gs}$ no longer will be greater than or equal to 0.0V. Thus, when $V_{in}$=1.2V, M8, M1 and M2 cooperate to clamp the voltage at node 28/30''' to V2.

Finally, when M8 turns on with $V_{in}$=1.8V, M1 and M2 turn on. The level of node B, $V_B$, is set at V3 according to the bias condition and transistor sizes of M3 and M4. For $V_{in}$=1.8V, the newly set voltage level of pull-down node B is higher than those set by $V_{in}$=0.6 and 1.2V due to reduced channel conductance of M4 for higher applied voltage. However, if current conduction through M1 and M2 causes $V_{in}$ to begin to rise above V3, M8 will turn off since its $V_{gs}$ no longer will be greater than or equal to 0.0V. Thus, when $V_{in}$=1.8V, M8, M1 and M2 cooperate to clamp the voltage at node 28/30''' to V3.

Therefore, the multi-state storage circuitry 50 of FIG. 10 can maintain more than two voltage levels, and each voltage level can represent a different logical state. The different voltage levels are written into the storage circuitry 50 via BL-W and M5 as described above with reference to FIGS. 3 and 4. Circuit techniques used to produce the different voltage levels for $V_{in}$ may include the use of different generators and/or internal voltage regulators. These techniques do not form a part of the present invention, and therefore, are not explained herein. Likewise, the different voltage levels are read via M7', M6 and BL-R as described above with reference to FIGS. 3 and 4.

Basically, to clamp the bit line discharge level, M7' can be implemented by a PMOS transistor since bit line voltage can be discharged down only to the stored voltage level plus Vtp, where Vtp is the threshold voltage of PMOS M7'. For example, V1 level is stored at the storage part, when the bit line voltage is discharged to V1+Vtp, PMOS transistor, M7' is turned off. Similarly, the bit line can be discharged to V0+Vtp, V2+Vtp, V3+Vtp for V0, V2 and V3, respectively. Circuit techniques used to read different voltage levels from the storage circuitry 50 include the use of a sense amplifier with different reference voltages or their combinations.

FIG. 11 is an illustrative drawing of a multi-level sense amplifier 600 that can be used with the embodiment of FIG. 10. The sense amplifier 600 includes first through fourth sense amplifiers 602-1 to 602-4 and first through fourth sense amplifier drivers 604-1 to 604-4. The sense amplifier also includes first through fourth NAND gates 606-1 to 606-4 and first through fourth output drivers 608-1 to 608-4. The various components are interconnected as shown by a network of interconnect lines 610.

Thus, the maximum voltage which node S can have is the gate voltage of M7' (voltage level of node 28/30''') plus the threshold voltage of M7', since M7' is a PMOS transistor. As explained above, the voltage of node C is set by the written voltage, V0, V1, V2 or V3. Therefore, the voltage level where BL-R can discharge in the read operation is $V_{tp}$ when the voltage level of node 28/30''' is 0V, where $V_{tp}$ is the threshold voltage of M7'. Since M7' is turned off when the voltage level of S is below $V_{tp}$, so the lowest voltage level where BL-R can discharge is $V_{tp}$. When a logic state, V1 is stored at node 28/30''', the minimum voltage which BL-R can discharge is $V_{tp}$+V1. Similarly, the minimum voltage levels when stored voltages are V2 and V3 are $V_{tp}$+V2 and $V_{tp}$+V3, respectively.

In a preferred embodiment, four sense amplifiers 602-1 to 602-4 are used to sense four different states. Each sense amplifier has a different reference level. Sense amplifier 602-1 has a $V_{ref1}$ set to have a value between $V_{tp}$ and $V_{tp}$+V1. Sense amplifier 602-2 has a $V_{ref2}$ set to be between $V_{tp}$+V1 and $V_{tp}$+V2. Sense amplifier 602-3 has a $V_{ref3}$ set to be between $V_{tp}$+V2 and $V_{tp}$+V3. Sense amplifier 602-4 has a Vref4 set to be larger than $V_{tp}$+V3. For a certain case, for example, the third amplifier 602-3 using $V_{ref3}$ can be omitted. Assume, for example, that the voltage of node 28/30''' is 0.0V, thus the BL-R is discharged to $V_{tp}$. Since all reference levels used for the amplifiers are higher than $V_{tp}$, all outputs of sense amplifiers (SO1, SO2, SO3 and SO4) are low. Since SO1-bar, SO2-bar, SO3-bar and SO4-bar are inverting signals of the outputs of sense amplifiers, only signal data-00 goes to high. Similarly, Data-01, Data-10 and Data-11 go to high when the stored voltage are V1, V2 and V3, respectively.

In essence, the clamp circuitry operates as a limiting circuit that limits a voltage swing on node 28/30''' as a function of an input voltage level $V_{in}$ most recently applied to node 28/30'''. More specifically, in one embodiment, the clamp circuitry operates as an adjustable voltage limiting circuit that adjustably limits the voltage level on node 28/30''' based upon the input signal voltage level $V_{in}$ (i.e., 0.0V, 0.6V, 1.2V, or 1.8V) most recently provided on node 28/30''' via input control circuitry 24'''. It will be appreciated that although only four different example voltage levels have been described for $V_{in}$, the multi-state storage circuitry 50 can store more than four different voltage levels representing more than four different logical states.

Various modifications to the preferred embodiments can be made without departing from the spirit and scope of the invention. For example, in another alternative embodiment one or more reference voltages $V_{refA}$ and $V_{refB}$ can be provided to the gates of M2 and M3, respectively in the embodiment of FIG. 10. Another alternative, for example, is to provide an additional address transistor in series with M5 in the write path of the embodiments of FIGS. 3, 5, 9 or 10. Since multiple write pass gates (M5s) are connected to a given WL-W at the same time in the memory array, when WL-W is enabled, each BL-W line connected to each cell is charged or discharged according to the cell data regardless of its operation. This can cause unwanted power consumption. Wherefore, by adding one more additional address transistors in series with the M5 of each cell, it is possible to use that other transistor to write to selected cells that shares the same WL-W, thereby reducing power consumption. Thus, the foregoing description is not intended to limit the invention which is described in the appended claims.

The invention claimed is:

1. An integrated circuit comprising:
a first NMOS transistor;
a first PMOS transistor;
a second NMOS transistor;
a second PMOS transistor;
a first bias node coupled to a first source/drain of the first NMOS transistor;
a second bias node coupled to a first source/drain of the second PMOS;
a third bias node coupled to a gate of the first PMOS transistor;
a fourth bias node coupled to a gate of the second NMOS transistor;
a pull-up node coupling a second source/drain of the first NMOS transistor to a first source/drain of the first PMOS transistor;
a pull-down node coupling a second source/drain of the second PMOS transistor to a first source/drain of the second NMOS transistor;
an input node;
a storage node coupling a second source/drain of the first PMOS transistor to a second source/drain of the second NMOS transistor;
an output node;
an input switch coupled to controllably communicate an input data value from the input node to a gate of the first NMOS transistor and to a gate of the second PMOS transistor; and
an output switch coupled to controllably communicate a stored data value from the storage node to the output node.

2. The integrated circuit of claim 1,
wherein the first bias node and the third bias node are coupled so as to be equipotential with respect to each other; and
wherein the second bias node and the fourth bias node are coupled so as to be equipotential with respect to each other.

3. The integrated circuit of claim 1,
wherein the third bias node and the fourth bias node are so as to be equipotential with respect to each other.

4. The integrated circuit of claim 1,
wherein the input switch and the output switch are controllable to cooperate such that,
the input switch communicates an input data value from the input node to the gate of the first NMOS transistor and to the gate of the second PMOS transistor while the output switch isolates the storage node from the output node; and
the output switch communicates a stored data value from the storage node to the output node while the input switch isolates the gate of the first NMOS transistor and the gate of the second PMOS transistor from the input node.

5. The integrated circuit of claim 1,
wherein the gate of the first NMOS transistor is coupled to the storage node; and
wherein the gate of the second PMOS transistor is coupled to the storage node.

6. The integrated circuit of claim 1,
wherein the gate of the first NMOS transistor is coupled to the storage node;
wherein the gate of the second PMOS transistor is coupled to the storage node;
wherein the input switch and the output switch are controllable to cooperate such that, the input switch communicates an input data value from the input node to the storage node and to the gate of the first NMOS transistor and to the gate of the second PMOS transistor while the output switch isolates the storage node from the output node; and
the output switch communicates an output data value from the storage node to the output node while the input switch isolates the storage node from the input node.

7. The integrated circuit of claim 1,
wherein the first and second NMOS transistors are depletion transistors; and
wherein the first and second PMOS transistors are depletion transistors.

8. The integrated circuit of claim 1,
wherein the first and second NMOS transistors are depletion transistors;
wherein the first and second PMOS transistors are depletion transistors;
wherein the input switch includes at least one enhancement transistor; and
wherein the output switch includes at least one enhancement transistor.

9. The integrated circuit of claim 1,
wherein the input switch includes an input transistor having a first source/drain coupled to the input node and having a second source/drain coupled to the gate of the first NMOS transistor and to the gate of the second PMOS transistor and having a gate that serves as an input switch control terminal.

10. The integrated circuit of claim 9,
wherein the input switch includes an enhancement type input transistor.

11. The integrated circuit of claim 9,
wherein the input switch includes an NMOS enhancement type input transistor.

12. The integrated circuit of claim 1,
wherein the input switch includes an input transistor having a first source/drain coupled to the input node and having a second source/drain coupled to the storage node and to the gate of the first NMOS transistor and to the gate of the second PMOS transistor and having a gate that serves as an input switch control terminal.

13. The integrated circuit of claim 12,
wherein the input switch includes an enhancement type input transistor.

14. The integrated circuit of claim 12,
wherein the input switch includes an NMOS enhancement type input transistor.

15. The integrated circuit of claim 12,
wherein the input switch includes a depletion type input transistor.

16. The integrated circuit of claim 12,
wherein the input switch includes an NMOS depletion type input transistor.

17. The integrated circuit of claim 1 further including:
a write bit line that includes the input node.

18. The integrated circuit of claim 1,
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node,
the second output transistor having a second source/drain coupled to the output node and having a gate that serves as an output switch control terminal.

19. The integrated circuit of claim 18,
wherein the first and second output transistors are an enhancement type transistors.

20. The integrated circuit of claim 18,
wherein the first and second output transistors are NMOS enhancement type transistors.

21. The integrated circuit of claim 18,
wherein the first and second output transistors are depletion type transistors.

22. The integrated circuit of claim 18,
wherein the first and second output transistors are an NMOS depletion type transistors.

23. The integrated circuit of claim 1 further including:
a read bit line that includes the output node.

24. The integrated circuit of claim 1 further including:
a read bit line that includes the output node;
a reference voltage source;
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node,
the second output transistor having a second source/drain coupled to the read bit line and having a gate that serves as an output switch control terminal;
a sense amplifier for sensing a difference between a reference voltage level and a read bit line voltage level.

25. The integrated circuit of claim 1 further including
a write bit line that includes the input node;
a read bit line that includes the output node;
a reference voltage source;
wherein the input switch includes an input transistor having a first source/drain coupled to the write bit line and having a second source/drain coupled to the storage node and to the gate of the first NMOS transistor and to the gate of the second PMOS transistor and having a gate that serves as an input switch control terminal;
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node, the second output transistor having a second source/drain coupled to the read bit line and having a gate that serves as an output switch control terminal;

a sense amplifier for sensing a difference between a reference voltage level and a read bit line voltage level.

26. The integrated circuit of claim 1 further including:
a write bit line that includes the input node;
a read bit line that includes the output node; and
precharge circuitry coupled only to the read bit line.

27. An integrated circuit comprising:
a first NMOS transistor;
a first PMOS transistor;
a second NMOS transistor;
a second PMOS transistor;
a first bias voltage node coupled to a first source/drain of the first NMOS transistor;
a second bias node coupled to a first source/drain of the second PMOS transistor;
a third bias node coupled to a gate of the first PMOS transistor;
a fourth bias node coupled to a gate of the second NMOS transistor;
a pull-up node coupling a second source/drain of the first NMOS transistor to a first source/drain of the first PMOS transistor;
a pull-down node coupling a second source/drain of the second PMOS transistor to a first source/drain of the second NMOS transistor;
an input node;
a storage node coupling a second source/drain of the first PMOS transistor to a second source/drain of the second NMOS transistor;
an output node;
an input switch coupled to controllably communicate from the input node to a gate of the first NMOS transistor and to a gate of the second PMOS transistor a data input signal that can have any of multiple prescribed input signal voltage levels;
limiting circuitry coupled to limit the storage node to a prescribed storage node voltage level determined by a most recent data input signal voltage level; and
an output switch coupled to controllably communicate from the storage node to the output node a data output signal indicating the determined storage node voltage level.

28. The integrated circuit of claim 27,
wherein the first bias node and the third bias node are coupled so as to be equipotential with respect to each other; and
wherein the second bias node and the fourth bias node are coupled so as to be equipotential with respect to each other.

29. The integrated circuit of claim 27,
wherein the third bias node and the fourth bias node are coupled so as to be equipotential with respect to each other.

30. The integrated circuit of claim 27,
wherein the input switch and the output switch are controllable to cooperate such that,
the input switch communicates a data input signal to the gate of the first NMOS transistor and to the gate of the second PMOS transistor while the output switch to isolates the storage node from the output node; and the output switch communicates a data output signal to the output node while the input switch isolates the gate of the first NMOS transistor and the gate of the second PMOS transistor from the input node.

31. The integrated circuit of claim 27,
wherein the gate of the first NMOS transistor is coupled to the storage node; and
wherein the gate of the second PMOS transistor is coupled to the storage node.

32. The integrated circuit of claim 27,
wherein the gate of the first NMOS transistor is coupled to the storage node;
wherein the gate of the second PMOS transistor is coupled to the storage node;
wherein the input switch and the output switch are controllable to cooperate such that,
the input switch communicates a data input signal to the storage node and to the gate of the first NMOS transistor and to the gate of the second PMOS transistor while the output switch isolates the storage node from the output node; and
the output switch transmits a data output signal to the output node while the input switch isolates the storage node from the input node.

33. The integrated circuit of claim 27,
wherein the first and second NMOS transistors are depletion transistors; and
wherein the first and second PMOS transistors are depletion transistors.

34. The integrated circuit of claim 27,
wherein the first and second NMOS transistors are depletion transistors;
wherein the first and second PMOS transistors are depletion transistors;
wherein the input switch includes at least one enhancement transistor; and
wherein the output switch includes at least one enhancement transistor.

35. The integrated circuit of claim 27,
wherein the input switch includes an input transistor having a first source/drain coupled to the input node and having a second source/drain coupled to the gate of the first NMOS transistor and to the gate of the second PMOS transistor and having a gate that serves as an input switch control terminal.

36. The integrated circuit of claim 35,
wherein the input switch includes an enhancement type input transistor.

37. The integrated circuit of claim 35,
wherein the input switch includes an NMOS enhancement type input transistor.

38. The integrated circuit of claim 27,
wherein the input switch includes an input transistor having a first source/drain coupled to the input node and having a second source/drain coupled to the storage node and to the gate of the first NMOS transistor and to the gate of the second PMOS transistor and having a gate that serves as an input switch control terminal.

39. The integrated circuit of claim 38,
wherein the input switch includes an enhancement type input transistor.

40. The integrated circuit of claim 38,
wherein the input switch includes an NMOS enhancement type input transistor.

41. The integrated circuit of claim 38,
wherein the input switch includes a depletion type input transistor.

42. The integrated circuit of claim 38,
wherein the input switch includes an NMOS depletion type input transistor.

43. The integrated circuit of claim 27 further including:
a write bit line that includes the input node.

44. The integrated circuit of claim 27,
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node,
the second output transistor having a second source/drain coupled to the output node and having a gate that serves as an output switch control terminal.

45. The integrated circuit of claim 44,
wherein the output switch the output signal comprises a discharge path signal.

46. The integrated circuit of claim 44,
wherein the first and second output transistors are an enhancement type transistors.

47. The integrated circuit of claim 44,
wherein the first and second output transistors are NMOS enhancement type transistors.

48. The integrated circuit of claim 47,
wherein the first and second output transistors are depletion type transistors.

49. The integrated circuit of claim 44,
wherein the first and second output transistors are an NMOS depletion type transistors.

50. The integrated circuit of claim 44,
wherein the first output transistor is a PMOS transistor; and
wherein the second output transistor is an NMOS transistor.

51. The integrated circuit of claim 27 further including:
a read bit line that includes the output node.

52. The integrated circuit of claim 27 further including:
a read bit line that includes the output node;
a reference voltage source;
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node,
the second output transistor having a second source/drain coupled to the read bit line and having a gate that serves as an output switch control terminal;
a sense amplifier for sensing a difference between a reference voltage level and a read bit line voltage level.

53. The integrated circuit of claim 52,
wherein the first output transistor is a PMOS transistor; and
wherein the second output transistor is an NMOS transistor.

54. The integrated circuit of claim 27 further including
a write bit line that includes the input node;
a read bit line that includes the output node;
a reference voltage source;
wherein the input switch includes an input transistor having a first source/drain coupled to the write bit line and having a second source/drain coupled to the storage node and to the gate of the first NMOS transistor and to the gate of the second PMOS transistor and having a gate that serves as an input switch control terminal;
wherein the output switch includes,
a first output transistor, and
a second output transistor, and
a discharge path,
the first output transistor having a first source/drain coupled to the discharge path and having a second source/drain coupled to a first source/drain of the second output transistor and having a gate coupled to the storage node,
the second output transistor having a second source/drain coupled to the read bit line and having a gate that serves as an output switch control terminal;
a sense amplifier for sensing a difference between a reference voltage level and a read bit line voltage level.

55. The integrated circuit of claim 54,
wherein the first output transistor is a PMOS transistor; and
wherein the second output transistor is an NMOS transistor.

56. The integrated circuit of claim 27,
wherein the limiting circuitry includes a switch coupled to turn off the first NMOS transistor in response to the storage node reaching the determined storage node voltage level.

57. The integrated circuit of claim 27,
wherein the limiting circuitry includes a switch coupled to clamp the storage node at the determined storage node voltage level by,
turning on the first NMOS transistor when the storage node is below the determined storage node voltage level; and
turning off the first NMOS transistor if the storage node begins to rise above the determined storage node voltage level.

58. The integrated circuit of claim 27,
wherein the limiting circuitry includes a fifth transistor with a first source/drain coupled to the gate of the first NMOS transistor, with a second source/drain coupled to the storage node, and with a gate coupled to the second node.

59. The integrated circuit of claim 27,
wherein the input switch is coupled to provide the data input signal to the storage node; and
wherein the limiting circuitry includes a fifth transistor with a first source/drain coupled to the gate of the first NMOS transistor, with a second source/drain coupled to the storage node, and with a gate coupled to the pull-down node.

60. The integrated circuit of claim 27,
wherein the limiting circuitry includes a fifth transistor with a first source/drain coupled to the gate of the first NMOS transistor, with a second source/drain coupled to the storage node, and with a gate coupled to the pull-down node; and
wherein the input switch is coupled to provide the input data signal to the second source/drain of the fifth transistor.

61. The integrated circuit of claim 27,
wherein the gate of the first PMOS transistor is coupled to the storage node; and wherein the gate of the second PMOS transistor is coupled to the storage node.

62. The integrated circuit of claim 27, wherein the gate of the first NMOS transistor is coupled to the storage node; wherein the gate of the second PMOS transistor is coupled to the storage node; wherein the limiting circuitry includes a fifth transistor with a first source/drain coupled to the gate of the first NMOS transistor, with a second source/drain coupled to the storage node, and with a gate coupled to the pull-down node; and wherein the input switch is coupled to the gate of the first NMOS transistor through the fifth transistor.

63. The integrated circuit of claim 27 wherein the multiple prescribed input voltage levels include multiple prescribed discrete input voltage levels.

64. The integrated circuit of claim 27, wherein the limiting circuitry includes a switch coupled to clamp the storage node at the determined storage node voltage level by, turning on the first NMOS transistor when a pull-down node voltage storage node is below a most recent data input voltage level; and turning off the first NMOS transistor if the pull-down node begins to rise above the most recent data input voltage level.

65. The integrated circuit of claim 27, wherein the gate of the first NMOS transistor is coupled to the storage node; wherein the gate of the second PMOS transistor is coupled to the storage node; wherein the limiting circuitry includes a switch coupled to clamp the storage node at the determined storage voltage level by, turning on the first NMOS transistor when a pull-down node voltage storage node is below a most recent data input voltage level; and turning off the first NMOS transistor if the pull-down node begins to rise above the most recent data input voltage level.

66. The integrated circuit of claim 27 further including: a write bit line that includes the input node; a read bit line that includes the output node; and precharge circuitry coupled only to the read bit line.

67. A method of accessing an integrated circuit including a first NMOS transistor with a first source/drain (S/D) coupled to a first bias node; a first PMOS transistor; a pull-up node coupling a second S/D of the first NMOS transistor to a first S/D of the first PMOS transistor; a second NMOS transistor; a second PMOS transistor with a first S/D coupled to a second bias node; a pull-down node coupling a second S/D of the second PMOS transistor to a first S/D of the second NMOS transistor; a storage node coupling a second S/D of the first PMOS transistor to a second S/D of the second NMOS transistor and coupling a gate of the first NMOS transistor to a gate of the second PMOS transistor, the method comprising:
providing a supply bias voltage to the first bias node;
providing an effective ground bias voltage to the second bias node;
providing the supply bias voltage to a gate of the first PMOS transistor;
providing the effective ground bias voltage to a gate of the second NMOS transistor; and
imparting a digital input signal having a first voltage level or a second voltage level to the gate of the first NMOS transistor and to the gate of the second PMOS transistor and to the storage node;
wherein a first voltage level digital input signal causes turn on the first NMOS transistor and the first PMOS transistor and reverse biasing of the second NMOS transistor and the second PMOS transistor; and
wherein a second voltage level digital input signal causes turn on the second NMOS transistor and the second PMOS transistor and reverse biasing of the first NMOS transistor and the first PMOS transistor.

68. The method of claim 67 further including:
after the step of imparting, sensing a voltage level of the storage node.

69. The method of claim 67 further including:
after the step of imparting,
sensing a voltage level of the storage node while the first NMOS transistor and the first PMOS transistor are turned on and the second NMOS transistor and the second PMOS transistor are reverse biased if the imparting step imparted a first voltage level digital input signal; and
sensing a voltage level of the storage node while the second NMOS transistor and the second PMOS transistor are turned on and the first NMOS transistor and the first PMOS transistor are reverse biased if the imparting step imparted a second voltage level digital input signal.

70. The integrated circuit of claim 67, wherein the first voltage level is the supply voltage level; and wherein the second voltage level is the effective ground voltage level.

71. A method of accessing an integrated circuit including a first NMOS transistor with a first source/drain (S/D) coupled to a first bias node; a first PMOS transistor; a pull-up node coupling a second S/D of the first NMOS transistor to a first S/D of the first PMOS transistor; a second NMOS transistor; a second PMOS transistor with a first S/D coupled to a second bias node; a pull-down node coupling a second S/D of the second PMOS transistor to a first S/D of the second NMOS transistor; a storage node coupling a second S/D of the first PMOS transistor to a second S/D of the second NMOS transistor and coupling a gate of the first NMOS transistor to a gate of the second PMOS transistor, the method comprising:
providing a supply bias voltage to the first bias node;
providing an effective ground bias voltage to the second bias node;
providing to a gate of the first PMOS transistor, a reference voltage level between the supply bias voltage level and the effective ground bias voltage level;
providing to a gate of the second NMOS transistor, a reference voltage level between the supply bias voltage level and the effective ground bias voltage level; and
imparting a digital input signal having a first voltage level or a second voltage level to the gate of the first NMOS transistor and to the gate of the second PMOS transistor and to the storage node;
wherein a first voltage level digital input signal causes turn on the first NMOS transistor and the first PMOS transistor and reverse biasing of the second NMOS transistor and the second PMOS transistor; and
wherein a second voltage level digital input signal causes turn on the second NMOS transistor and the second PMOS transistor and reverse biasing of the first NMOS transistor and the first PMOS transistor.

72. The method of claim 71 further including:
after the step of imparting, sensing a voltage level of the storage node.

73. The method of claim 71 further including:
after the step of imparting,
sensing a voltage level of the storage node while the first NMOS transistor and the first PMOS transistor are turned on and the second NMOS transistor and the second PMOS transistor are reverse biased if the imparting step imparted a first voltage level digital input signal; and
sensing a voltage level of the storage node while the second NMOS transistor and the second PMOS transistor are turned on and the first NMOS transistor and the first PMOS transistor are reverse biased if the imparting step imparted a second voltage level digital input signal.

74. The integrated circuit of claim 71,
wherein the first voltage level is the supply voltage level; and
wherein the second voltage level is the effective ground voltage level.

75. The integrated circuit of claim 71,
wherein the first voltage level is the supply voltage level;
wherein the second voltage level is the effective ground voltage level; and
wherein the reference voltage level is half-way between the supply bias voltage level and the effective ground bias voltage level.

76. A method of storing a data value in an integrated circuit including a first NMOS transistor with a first source/drain (S/D) coupled to a first bias voltage level; a first PMOS transistor; a pull-up node coupling a second S/D of the first NMOS transistor to a first S/D of the first PMOS transistor; a second NMOS transistor; a second PMOS transistor with a first S/D coupled to a second bias voltage level; a pull-down node coupling a second S/D of the second PMOS transistor to a first S/D of the second NMOS transistor; an input node; a storage node coupling a second S/D of the first PMOS transistor to a second S/D of the second NMOS transistor and coupling a gate of the first NMOS transistor to a gate of the second PMOS transistor; an output node; an input switch coupled to communicate data input signal information from the input node to the storage node; and an output switch to communicate data output signal information from the output node to the storage node, the method comprising:
providing a third bias voltage to a gate of the first PMOS transistor;
providing a fourth bias voltage to a gate of the second NMOS transistor; and
using the input switch to transmit data input signal information from the input node to the gate of the first NMOS transistor and to the gate of the second PMOS transistor and to the storage node while using the output switch to isolate the storage node from the output node.

77. The method of claim 76,
wherein the first and third bias voltage levels are the same; and
wherein the second and fourth bias voltage levels are the same.

78. The method of claim 76,
wherein the third bias voltage level is between the first and second bias voltage; and
wherein the fourth bias voltage level is between the first and second bias voltage levels.

79. The method of claim 76,
wherein the third bias voltage level is between the first and second bias voltage;
wherein the fourth bias voltage level is between the first and second bias voltage levels; and
wherein the third and fourth bias voltage levels are the same.

80. The method of claim 76,
wherein the third bias voltage level is selected to set a voltage level of the pull-up node at which the first NMOS transistor and the first PMOS transistor become reverse biased in response to a high-to-low of data signal transition; and
wherein the fourth bias voltage level is selected to set a voltage level of the pull-down node at which the second NMOS transistor and the second PMOS transistor become reverse biased in response to a low-to-high of data signal transition.

81. A method of retrieving a data value an integrated circuit including a first NMOS transistor with a first source/drain (S/D) coupled to a first bias voltage level; a first PMOS transistor; a pull-up node coupling a second S/D of the first NMOS transistor to a first S/D of the first PMOS transistor; a second NMOS transistor; a second PMOS transistor with a first S/D coupled to a second bias voltage level; a pull-down node coupling a second S/D of the second PMOS transistor to a first S/D of the second NMOS transistor; an input node; a storage node coupling a second S/D of the first PMOS transistor to a second S/D of the second NMOS transistor and coupling a gate of the first NMOS transistor to a gate of the second PMOS transistor; an output node; an input switch coupled to communicate data input signal information from the input node to the storage node; and an output switch to communicate data output signal information from the output node to the storage node, the method comprising
providing a third bias voltage to a gate of the first PMOS transistor;
providing a fourth bias voltage to a gate of the second NMOS transistor; and
using the output switch to transmit output data signal information from the storage node to the output node while using the input switch to isolate the storage node from the input node.

82. The method of claim 81,
wherein the first and third bias voltage levels are the same; and
wherein the second and fourth bias voltage levels are the same.

83. The method of claim 81,
wherein the third bias voltage level is between the first and second bias voltage; and
wherein the fourth bias voltage level is between the first and second bias voltage levels.

84. The method of claim 81,
wherein the third bias voltage level is between the first and second bias voltage;
wherein the fourth bias voltage level is between the first and second bias voltage levels; and
wherein the third and fourth bias voltage levels are the same.

85. The method of claim 81,
wherein the third bias voltage level is selected to set a voltage level of the pull-up node at which the first NMOS transistor and the first PMOS transistor become reverse biased in response to a high-to-low input data transition; and wherein the fourth bias voltage level is selected to set a voltage level of the pull-down node at which the second NMOS transistor and the second PMOS transistor become reverse biased in response to a low-to-high input data transition.

86. A method of accessing an integrated circuit including a first NMOS transistor with a first source/drain (S/D) coupled to a first bias node; a first PMOS transistor; a pull-up node coupling a second S/D of the first NMOS transistor to a first S/D of the first PMOS transistor; a second NMOS transistor; a second PMOS transistor with a first S/D coupled to a second bias node; a pull-down node coupling a second S/D of the second PMOS transistor to a first S/D of the second NMOS transistor; a storage node coupling a second S/D of the first PMOS transistor to a second S/D of the second NMOS transistor and coupling a gate of the first NMOS transistor to a gate of the second PMOS transistor, the method comprising:

providing a supply bias voltage to the first bias node;
providing an effective ground bias voltage to the second bias node;
providing the supply bias voltage to a gate of the first PMOS transistor;
providing the effective ground bias voltage to a gate of the second NMOS transistor; and
imparting a digital input signal having any of multiple respective voltage levels to the gate of the first NMOS transistor and to the gate of the second PMOS transistor and to the storage node;
regulating turn on of the first NMOS transistor as a function of voltage of the pull-down node so as to limit the storage node to a voltage level determined by the respective voltage level of the imparted digital input signal.

87. The method of claim 86 further including:
after the step of imparting, sensing a voltage level of the storage node.

88. A method of accessing an integrated circuit including a first NMOS transistor with a first source/drain (S/D) coupled to a first bias voltage node; a first PMOS transistor; a pull-up node coupling a second S/D of the first NMOS transistor to a first S/D of the first PMOS transistor; a second NMOS transistor; a second PMOS transistor with a first S/D coupled to a second bias node; a pull-down node coupling a second S/D of the second PMOS transistor to a first S/D of the second NMOS transistor; a storage node coupling a second S/D of the first PMOS transistor to a second S/D of the second NMOS transistor and coupling a gate of the first NMOS transistor to a gate of the second PMOS transistor, the method comprising:

providing a supply bias voltage to the first bias node;
providing an effective ground bias voltage to the second bias node;
providing to a gate of the first PMOS transistor, a reference voltage level between the supply bias voltage level and the effective ground bias voltage level;
providing to a gate of the second NMOS transistor, a reference voltage level between the supply bias voltage level and the effective ground bias voltage level; and
imparting a digital input signal having any of multiple respective voltage levels to the gate of the first NMOS transistor and to the gate of the second PMOS transistor and to the storage node;
regulating turn on of the first NMOS transistor as a function of voltage of the pull-down node so as to limit the storage node to a voltage level determined by the respective voltage level of the imparted digital input signal.

89. The method of claim 88 further including:
after the step of imparting, sensing a voltage level of the storage node.

90. A method of storing a data value in an integrated circuit including a first NMOS transistor with a first source/drain (S/D) coupled to a first bias voltage level; a first PMOS transistor; a pull-up node coupling a second S/D of the first NMOS transistor to a first S/D of the first PMOS transistor; a second NMOS transistor; a second PMOS transistor with a first S/D coupled to a second bias voltage level; a pull-down node coupling a second S/D of the second PMOS transistor to a first S/D of the second NMOS transistor; an input node; a storage node coupling a second S/D of the first PMOS transistor to a second S/D of the second NMOS transistor and coupling a gate of the first NMOS transistor to a gate of the second PMOS transistor; an output node; an input switch coupled to communicate input data signal information from the input node to the storage node; and an output switch coupled to communicate output data signal information from the output node to the storage node, the method comprising:

providing a third bias voltage to a gate of the first PMOS transistor;
providing a fourth bias voltage to a gate of the second NMOS transistor;
using the input switch to transmit input data signal information from the input node to the gate of the first NMOS transistor and to the gate of the second PMOS transistor while using the output switch to isolate the storage node from the output node; and
limiting the storage node to a prescribed storage node voltage level determined by a most recent input data signal voltage level.

91. The method of claim 90,
wherein the first and third bias voltage levels are the same; and
wherein the second and fourth bias voltage levels are the same.

92. The method of claim 90,
wherein the third bias voltage level is between the first and second bias voltage; and
wherein the fourth bias voltage level is between the first and second bias voltage levels.

93. The method of claim 90,
wherein the third bias voltage level is between the first and second bias voltage;
wherein the fourth bias voltage level is between the first and second bias voltage levels; and
wherein the third and fourth bias voltage levels are the same.

94. The method of claim 90,
wherein the third bias voltage level is selected to set a voltage level of the pull-up node at which the first NMOS transistor and the first PMOS transistor become reverse biased in response to a high-to-low of data signal transition; and
wherein the fourth bias voltage level is selected to set a voltage level of the pull-down node at which the second NMOS transistor and the second PMOS transistor become reverse biased in response to a low-to-high of data signal transition.

95. The method of claim 90,
wherein the prescribed storage voltage level is further determined by a difference between a storage node voltage level and a voltage level of the pull-down node.

96. A method of retrieving a data value an integrated circuit including: a first NMOS transistor with a first source/drain (S/D) coupled to a first bias voltage level; a first PMOS transistor; a pull-up node coupling a second S/D of the first NMOS transistor to a first S/D of the first PMOS transistor; a second NMOS transistor; a second PMOS transistor with a first S/D coupled to a second bias voltage level; a pull-down node coupling a second S/D of the second PMOS transistor to a first S/D of the second NMOS transistor; an input node; a storage node coupling a second S/D of the first PMOS transistor to a second S/D of the second NMOS transistor and coupling a gate of the first NMOS transistor to a gate of the second PMOS transistor; an output node; an input switch coupled to communicate input data signal information from the input node to the storage node; and an output switch coupled to communicate output data signal information from the output node to the storage node, the method comprising:
  providing a third bias voltage to a gate of the first PMOS transistor;
  providing a fourth bias voltage to a gate of the second NMOS transistor;
  using the output switch to communicate data signal information from the storage node to the output node while using the input switch to isolate the storage node from the input node; and
  limiting the storage node to a prescribed storage node voltage level determined by a most recent input data signal voltage level.

97. The method of claim 96,
wherein the first and third bias voltage levels are the same; and
wherein the second and fourth bias voltage levels are the same.

98. The method of claim 96,
wherein the third bias voltage level is between the first and second bias voltage; and
wherein the fourth bias voltage level is between the first and second bias voltage levels.

99. The method of claim 96,
wherein the third bias voltage level is between the first and second bias voltage;
wherein the fourth bias voltage level is between the first and second bias voltage levels; and
wherein the third and fourth bias voltage levels are the same.

100. The method of claim 96,
wherein the third bias voltage level is selected to set a voltage level of the pull-up node at which the first NMOS transistor and the first PMOS transistor become reverse biased in response to a high-to-low of data signal transition; and
wherein the fourth bias voltage level is selected to set a voltage level of the pull-down node at which the second NMOS transistor and the second PMOS transistor become reverse biased in response to a low-to-high of data signal transition.

101. The method of claim 96,
wherein the prescribed storage voltage level is further determined by a difference between a storage node voltage level and a voltage level of the pull-down node.

* * * * *